United States Patent
Eriguchi et al.

[11] Patent Number: 6,033,928
[45] Date of Patent: Mar. 7, 2000

[54] METHOD OF MANUFACTURING AGGREGATE OF SEMICONDUCTOR MICRO-NEEDLES

[75] Inventors: Koji Eriguchi; Masafumi Kubota; Masaaki Niwa, all of Osaka; Noboru Nomura, Kyoto, all of Japan

[73] Assignee: Matsushita Electric Industrial Co., Ltd., Osaka, Japan

[21] Appl. No.: 08/333,320

[22] Filed: Nov. 2, 1994

[30] Foreign Application Priority Data

| Nov. 2, 1993 | [JP] | Japan | 5-274191 |
| Nov. 17, 1993 | [JP] | Japan | 5-312747 |
| Jul. 14, 1994 | [JP] | Japan | 6-162028 |

[51] Int. Cl.⁷ ................................. H01L 21/32
[52] U.S. Cl. .................. 438/42; 438/488; 438/964
[58] Field of Search ................ 257/9, 13, 28, 257/30, 39, 79, 103, 465, 466; 437/3, 23, 228 ST, 228 TI, 233, 127, 919, 905, 47, 52, 60, 977; 148/DIG. 138

[56] References Cited

U.S. PATENT DOCUMENTS

| 5,102,832 | 4/1992 | Tuttle | 437/233 |
| 5,112,773 | 5/1992 | Tuttle | 437/233 |
| 5,204,280 | 4/1993 | Dhong et al. | 437/228 ST |
| 5,227,322 | 7/1993 | Ko et al. | 437/919 |
| 5,240,558 | 8/1993 | Kawasaki et al. | 437/233 |
| 5,244,842 | 9/1993 | Cathey et al. | 437/977 |
| 5,256,587 | 10/1993 | Jun et al. | 437/919 |
| 5,308,786 | 5/1994 | Lur et al. | 437/67 |
| 5,427,974 | 6/1995 | Lur et al. | 437/919 |
| 5,427,977 | 6/1995 | Yamada et al. | 437/173 |
| 5,466,626 | 11/1995 | Armacost et al. | 437/52 |

FOREIGN PATENT DOCUMENTS

| 0 544 408 | 6/1993 | European Pat. Off. |
| 0 567 748 | 11/1993 | European Pat. Off. |
| 4-356977 | 12/1992 | Japan . |
| 5-37012 | 2/1993 | Japan . |
| 5-37013 | 2/1993 | Japan . |
| 5055627 | 5/1993 | Japan . |
| 5-206514 | 8/1993 | Japan . |
| 5-251725 | 9/1993 | Japan . |
| WO91/09420 | 6/1991 | WIPO . |

OTHER PUBLICATIONS

H.I. Liu, et al., J. Vac. Sci. Technol, B 10(6) (1992) 2846 ". . . Si Columns for Light Emission Study".

E.G. Lee, et al., J. Mater. Sci., 28(1993) 6279 "A Study of Morphology . . . of LPCVD Si".

Y. Hayashuide, et al., Jpn. J. Appl. Phys., 29(12) (1990) L2345 ". . . Capacitors with a Rough Electrode".

A.G. Nassiopoulos et al., Appl. Phys. Lett., 66(9) (1995) L114 "Visible Luminescence from One and Two Dimensional . . . ".

L.T. Canman, Appl. Phys. Lett. 57(10) (1990) 1046 "Silicon Quantum Wire Array Fabrication . . . ".

(List continued on next page.)

*Primary Examiner*—Charles L. Bowers, Jr.
*Assistant Examiner*—Leon Padomsky
*Attorney, Agent, or Firm*—McDermott, Will & Emery

[57] ABSTRACT

On a silicon substrate is formed a silicon dioxide film and then hemispherical grains made of silicon, each having an extremely small diameter, are deposited thereon by LPCVD. After annealing the hemispherical grains, the silicon dioxide film is etched using the hemispherical grains as a first dotted mask, thereby forming a second dotted mask composed of the silicon dioxide film. The resulting second dotted mask is used to etch the silicon substrate to a specified depth from the surface thereof, thereby forming an aggregate of semiconductor micro-needles. Since the diameter of each of the semiconductor micro-needles is sufficiently small to cause the quantum size effects as well as has only small size variations, remarkable quantum size effects can be obtained. Therefore, it becomes possible to constitute a semiconductor apparatus with a high information-processing function by using the aggregate of semiconductor micro-needles (quantized region).

12 Claims, 31 Drawing Sheets

OTHER PUBLICATIONS

W. Chen, et al., Appl. Phys. Lett., 63(8) (1993) 1116 "Fabrication of . . . Si Pillars of <10nm Diameter".

M.I. Liu, et al., Appl. Phys. Lett., 64(11) (1994) 1383 "Self–Limiting Oxidation for . . . Sub–5nm Si Nanowires".

IBM Tech. Discl. Bulletin, 34(5) (1991) 381 "Controlled Surface Texturing of Materials".

"Process Technique—From Two–Dimension To Three–Dimension" by Integrated Circuit Research of Tokyo Shibaura Denki Ltd. Research Chief Staff Masahiro Kashiwagi, pp. 75–82.

Liu et al., "Silicon Quantum Wires Oxidation And Transport Studies", Materials Science and Devices Symposium Proceedings, vol. 283, pp. 57–63, Nov. 1992.

Hiruma et al., "GaAs Free–Standing Quantum–Size Wires", Journal of Applied Physics, vol. 74, No. 5, pp. 3162–3171, Sep. 1993.

Watanabe et al., "Hemispherical Grain Silicon for High Density DRAMs", Solid State Technology, vol. 35, No. 7, pp. 29–33, Jul. 1992.

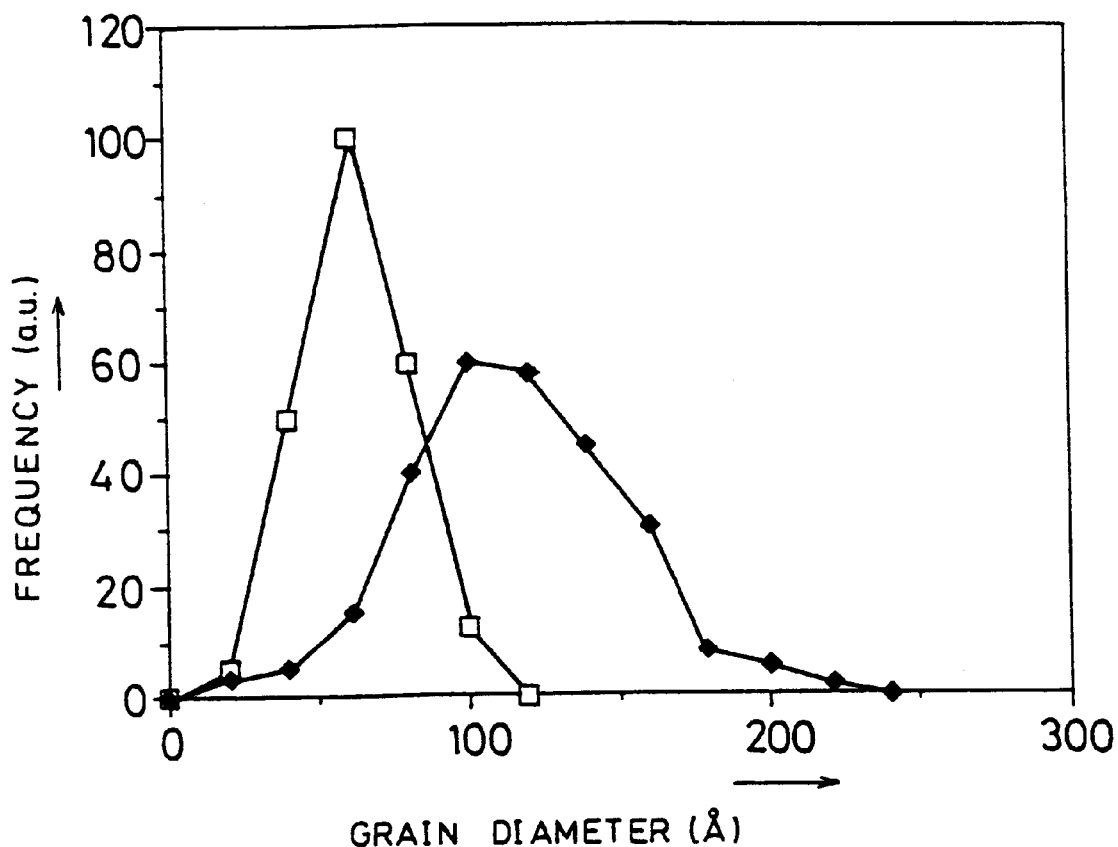

Fig. 16
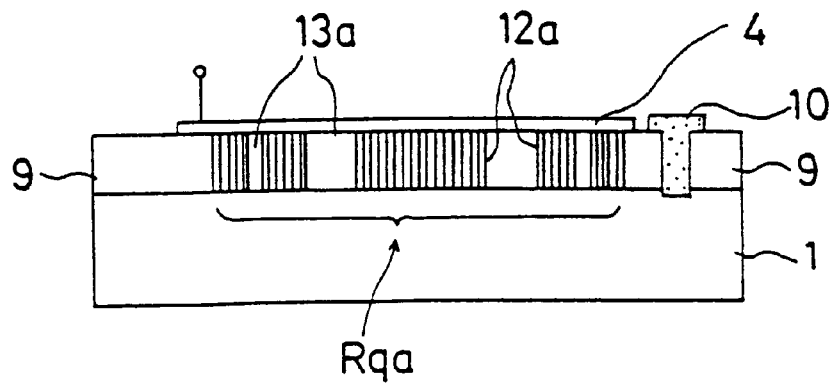
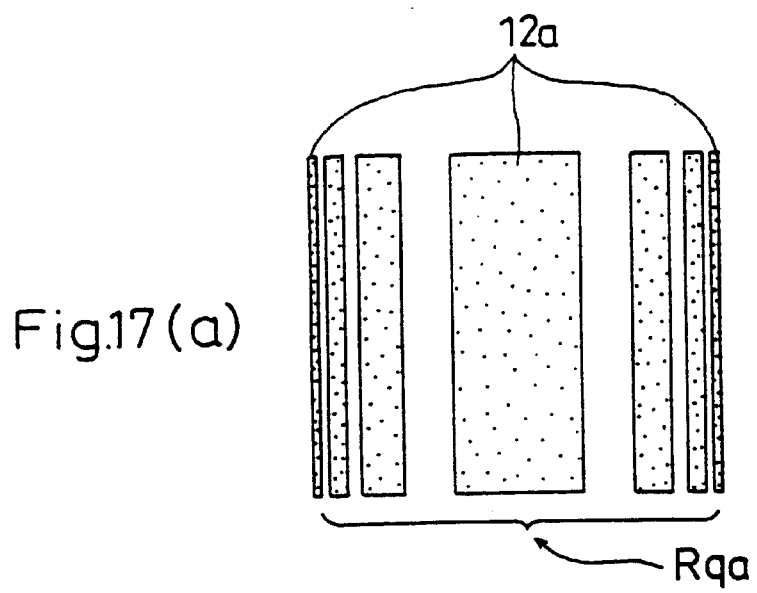
Fig.17(a)
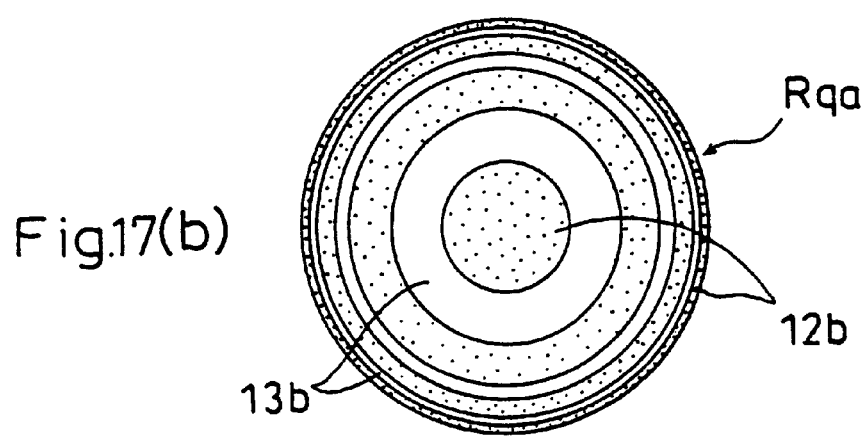
Fig.17(b)

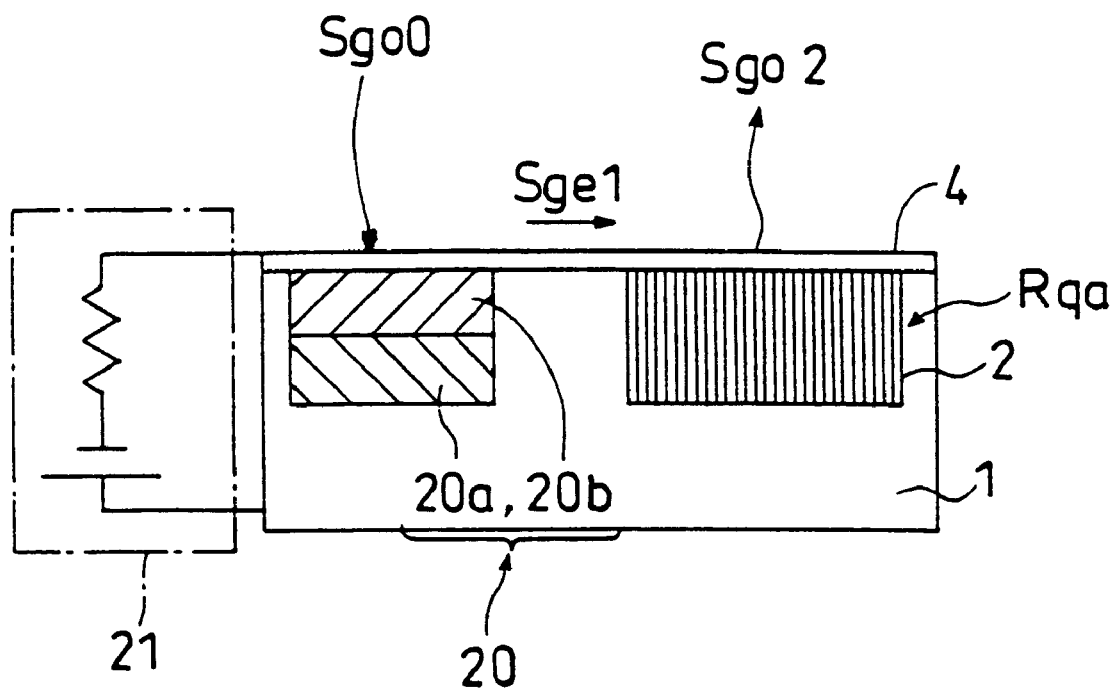

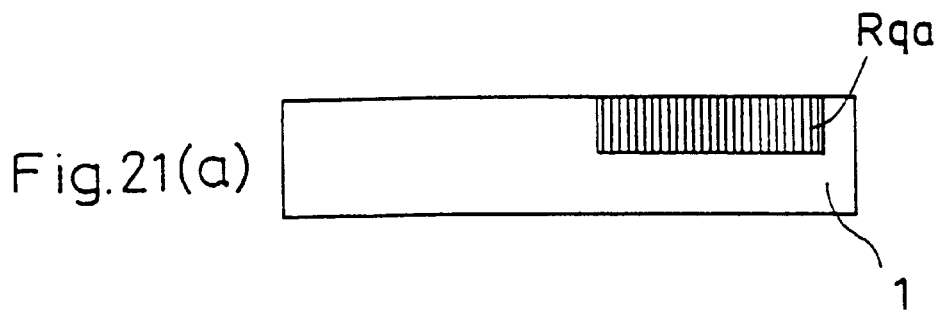
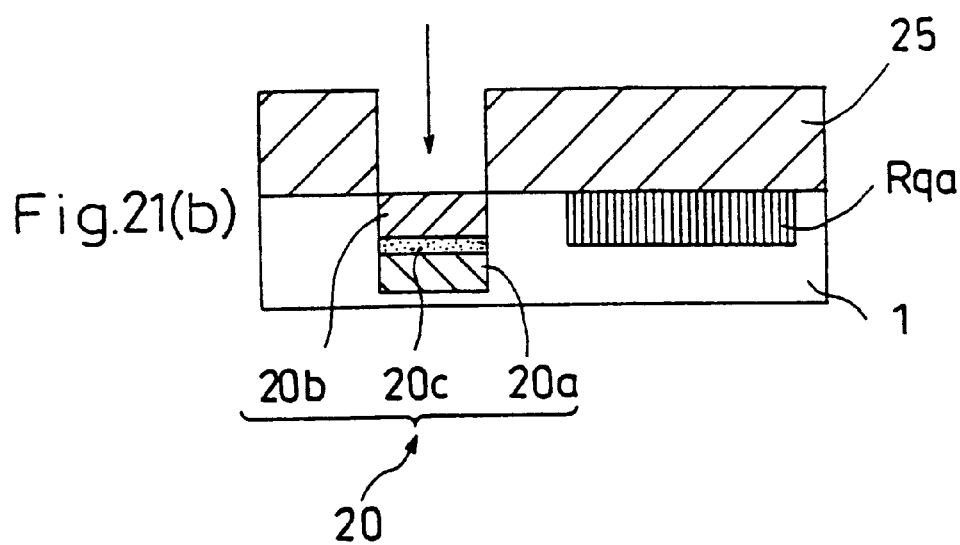
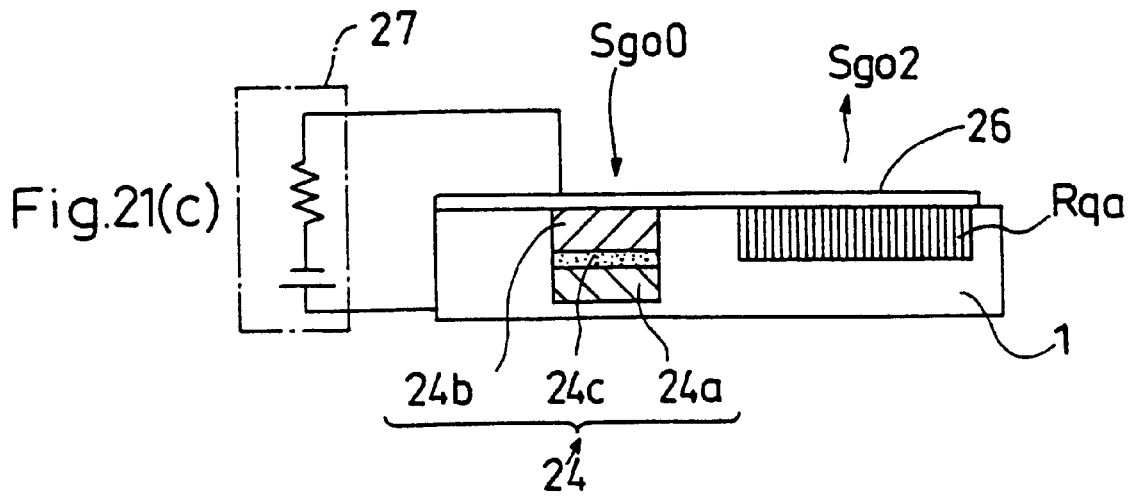

FIG. 25(a-1)
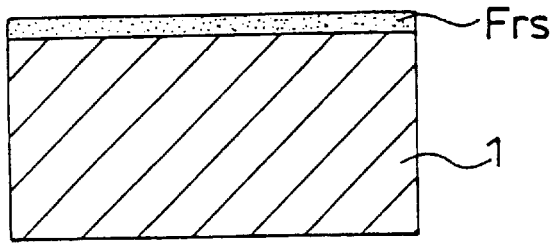
FIG. 25(a-2)
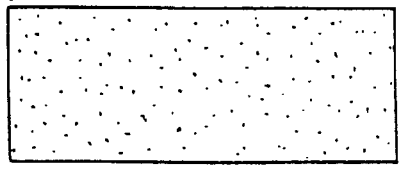
FIG. 25(b-1)
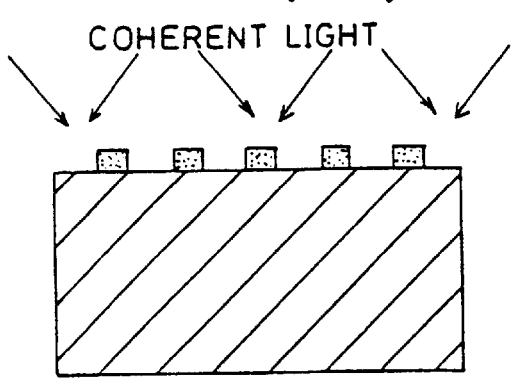
FIG. 25(b-2)
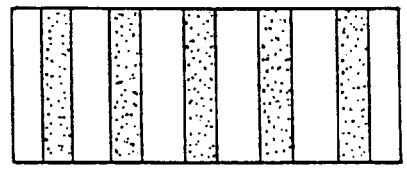
FIG. 25(c-1)
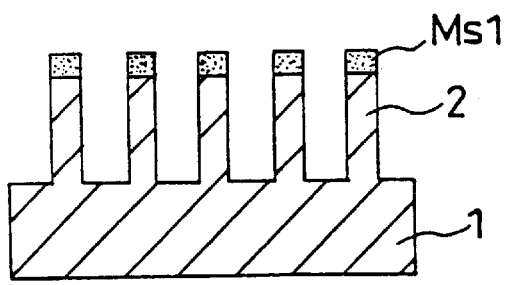
FIG. 25(c-2)
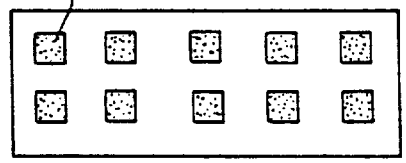
FIG. 25(d-1)
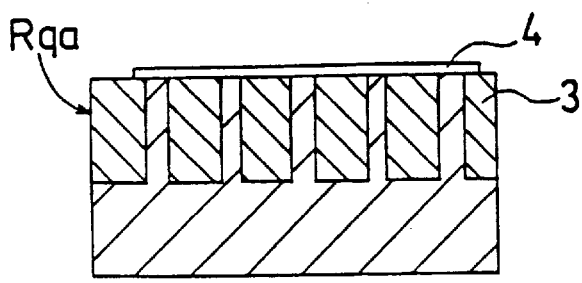
FIG. 25(d-2)
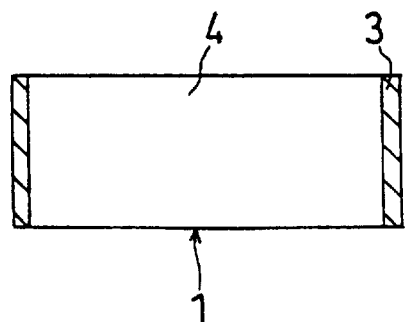

METHOD OF MANUFACTURING AGGREGATE OF SEMICONDUCTOR MICRO-NEEDLES

BACKGROUND OF THE INVENTION

In recent years, there has been developed an optical element in which porous silicon is formed to be used as a light emitting element. Japanese Laid-Open Patent Publication No. 4-356977 discloses such an optical element, in which a large number of micro-pores 102 are formed in the surface region of a silicon substrate 101 by anodization, as shown in FIG. 33. If the porous silicon is irradiated with light, photoluminescence having its absorption edge in the visible region is observed, which implements a light-receiving/light-emitting element using silicon. That is, in a normal semiconductor apparatus composed of single-crystal silicon, an excited electron makes an indirect transition to a lower energy level so that the energy resulting from the transition is converted into heat, which renders light emission in the visible region difficult. However, there has been reported a phenomenon that, if silicon has a walled structure, such as porous silicon, and its wall thickness is about 0.01 $\mu$m, the band width of the silicon is enlarged to 1.2 to 2.5 eV due to the quantum size effects, so that an excited electron makes a direct transition between the bands, which enables light emission.

It has also been reported that two electrodes are provided on both ends of the porous silicon so that electroluminescence is observed by the application of an electric field.

However, if electroluminescence is to be obtained by the application of an electric field or photoluminescence is to be obtained by the irradiation with light of the porous silicon formed by anodization in the surface region of the silicon substrate 101 as shown in FIG. 33, the following problems are encountered.

That is, the diameter and depth of the micro-pore 102 formed by anodization are difficult to control. In addition, the configuration of the micro-pore 102 is complicated and the distribution of its wall thickness is extremely random. As a result, if etching is intensely performed in order to reduce the wall thickness, the wall portions may be partially torn and peeled off the substrate. Moreover, since the distribution of the wall thickness is random, the quantum size effects are not generated uniformly over the whole wall portions, so that light emission with a sharp emission spectrum cannot be obtained. Furthermore, the wall surface of the micro-pore in the porous silicon readily adsorbs molecules and atoms during anodization, due to its complicated configuration. Under the influence of the atoms and molecules attached to the surface of the silicon, the resulting optical element lacks the capability of reproducing a required emission wavelength and its lifespan is also reduced.

On the other hand, with the development of the present information-oriented society, a semiconductor apparatus in which a semiconductor integrated circuit is disposed has presented an increasing tendency toward the personalization of advanced info-communication appliances with large capacities. In other words, there has been a demand for appliances which enable advanced information transmission to and from a handheld computer or cellular phone. To meet the demand, it is required to not only enhance the performance of the conventional semiconductor apparatus, which processes only electric signals, but also implement a multi-function semiconductor apparatus which processes light, sounds, etc., as well as electric signals. FIG. 34 shows the cross sectional structure of a three-dimensional integrated circuit system that has been developed in order to satisfy the requirements. Such a three-dimensional integrated circuit system is expected to surmount the miniaturization limit inherent in the conventional two-dimensional integrated circuit system as well as improve and diversify functions to be performed. In the drawing, a PMOSFET 110a consisting of a source 103, a drain 104, a gate oxide film 105, and a gate 106 is formed in the surface region of an n-well 102, which is formed in a p-type silicon substrate 101a as a first layer. In the surface region of the first-layer silicon substrate 101a are formed semiconductor apparatus including an NMOSFET 110b consisting of the source 103, drain 104, gate oxide film 105, and gate 106. There are also formed a connecting wire 107 between the source and drain regions and an inter-layer insulating film 108 for covering each region, which has been flattened. On the inter-layer insulating film 108 is formed a second-layer silicon substrate 101b made of single-crystal silicon. On the second-layer silicon substrate 101b are also formed semiconductor apparatus such as the PMOSFET 110a and NMOSFET 110b, similarly to the semiconductor apparatus on the above first-layer silicon substrate 101a. The semiconductor apparatus in the first layer and the semiconductor apparatus in the second layer are electrically connected via a metal wire 109 (see, e.g., "Extended Abstracts of 1st Symposium on Future Electron Devices," p.76, May 1982).

However, such a three-dimensional integrated circuit system has the following problems. The wire 109 is formed by a deposition method in which, after a contact hole was formed, a wiring material is deposited and buried in the contact hole. Since the resulting contact hole becomes extremely deep, deficiencies such as an increase in resistance value and a break in wiring are easily caused by a faulty burying of the wiring material, resulting in poor reliability. With such problematic manufacturing technology, it is difficult to implement a three-dimensional integrated circuit system which can be used practically. In particular, it is extremely difficult to implement an integrated circuit system in more than three dimensions.

SUMMARY OF THE INVENTION

The present invention has been achieved by focusing on the fact that, if a structure in which a large number of semiconductor micro-needles are arranged is used instead of a porous structure, the diameters of the semiconductor micro-needles become uniform. It is therefore a first object of the present invention to provide a quantized region for implementing intense light emission with a narrow wavelength distribution, such as electroluminescence or photoluminescence, and conversion of optical signals to electric signals.

A second object of the present invention is to provide a semiconductor apparatus with an advanced information processing function by incorporating an aggregate of semiconductor micro-needles with various signal converting functions into an integrated circuit system.

To attain the above first object, an aggregate of semiconductor micro-needles according to the present invention comprises, as their basic structure, a large number of semiconductor micro-needles juxtaposed in a substrate, each of said semiconductor micro-needles having a diameter sufficiently small to cause the quantum size effects.

With the basic structure, the band width of a semiconductor material composing the semiconductor micro-needles is expanded due to the so-called quantum size effects. As a result, the direct transitions of electrons occur even in a semiconductor material such as silicon in which excited electrons make indirect transitions in the proper size to cause the quantum size effects. Consequently, it becomes possible to constitute a light emitting element, wavelength converting element, light receiving element, or the like in which the aggregate of semiconductor micro-needles is disposed by using the photoluminescence and electroluminescence resulting from the quantum size effects of each semiconductor micro-needle, variations in electric characteristics caused by the radiation of light, and the like. In this case, unlike a conventional quantized region composed of silicon with a porous structure or the like, the quantized region according to the present invention is constituted by the aggregate of semiconductor micro-needles, so that the diameter of each semiconductor micro-needle becomes sufficiently small to cause significant quantum size effects and becomes uniform even if the diameter faces any direction in a plane perpendicular to the axial direction.

In the structure of the above aggregate of semiconductor micro-needles, it is preferable that each of the above semiconductor micro-needles is formed substantially perpendicular to the surface of the above substrate and that the above semiconductor micro-needles are formed discretely.

In the above aggregate of semiconductor micro-needles, a protective layer can be obtained by forming an insulating layer on the side portions of the semiconductor micro-needles. In particular, it becomes possible to obtain light from the lateral side of the semiconductor micro-needles by composing the insulating layer of an oxide.

By composing the insulating layer of two layers of an inner oxide layer and an outer nitride layer over the inner oxide layer, it becomes possible to exert a compressive stress on each semiconductor micro-needle without preventing the obtention of light from the lateral side of the aggregate of semiconductor micro-needles, thereby remarkably exerting the quantum size effects.

To attain the above second object, a semiconductor apparatus according to the present invention comprises as its basic structure: a silicon substrate; and a quantized region composed of an aggregate of semiconductor micro-needles, each of said semiconductor micro-needles extending from the surface of the above silicon substrate to a specified depth and having a diameter sufficiently small to cause the quantum size effects.

With the basic structure, there can be implemented a semiconductor apparatus with excellent performance utilizing the remarkable quantum size effects of the aggregate of semiconductor micro-needles described above. Hereinafter, it will be assumed that an electric signal and optical signal input to the quantized region are a first electric signal and first optical signal, respectively, while signals output from the quantized region are a second electric signal and second optical signal, respectively.

The following elements can be added to the basic structure of the above semiconductor apparatus.

It is possible to provide an optical-signal generating means for generating a first optical signal so that the first optical signal is made incident upon the above quantized region and that the above first quantized region receives the first optical signal from the above optical-signal generating means and generates a second optical signal. With the structure, the quantized region functions as an optical converting element.

It is possible to form a trench in a part of the above silicon substrate and to provide the above quantized region and optical-signal generating means on both sides of the above trench, so that they face each other. With the structure, the semiconductor apparatus constitutes a two-dimensional integrated circuit system with an advanced information processing function comparable to a three-dimensional integrated circuit system.

It is possible to provide an upper electrode over the above quantized region so that the upper electrode is electrically connected to the upper end of each of the above semiconductor micro-needles. With the structure, it becomes possible to convert electric signals into optical signals and vice versa via the quantized region.

It is possible to add optical detecting means for receiving the second optical signal generated in the above quantized region and generating a third electric signal.

It is possible to provide the above light detecting means in a portion different from the above quantized region of the above silicon substrate and to compose the above light detecting means of an aggregate of semiconductor micro-needles each having a diameter sufficiently small to cause the quantum size effects.

It is possible to constitute the quantized region of the above basic structure so that it receives a first optical signal and generates a second electric signal and it is possible to provide: optical-signal generating means for generating the above first optical signal so that the first optical signal is made incident upon the above quantized region; and an electric circuit for processing the second electric signal generated in the above quantized region.

It is possible to provide stress generating means for generating a stress in each of the above semiconductor micro-needles in the above quantized region, the above stress being in the axial direction of each of the above semiconductor micro-needle, and to constitute the above quantized region so that it receives the above first electric signal and generates the second optical signal having a wavelength corresponding to the stress in each of the above semiconductor micro-needles. With the above structure, the semiconductor apparatus is provided with a force-to-optical signal converting function. In this case, the force-to-optical signal converting function is particularly enhanced by composing the above stress generating means of the above upper electrode and of a probe connected to the upper electrode so as to transmit a mechanical force from the outside.

The upper electrode of the above basic structure can be made of a transparent material. With the structure, it becomes possible to input the first electric signal to the quantized region without preventing the obtention of the second optical signal from each semiconductor micro-needle in the quantized region in its axial direction.

It is possible to provide on the above upper electrode a condensing means, such as a concave lens, for condensing the second optical signal generated in the above quantized region, which functions as a light-emitting element for generating the second optical signal. It is also possible to divide the above quantized region into a plurality of linearly striped quantized regions in which the aggregate of the above semiconductor micro-needles is formed into linear stripes in a plane parallel to the surface of the silicon substrate, to provide linearly striped discrete layers for separating and insulating the above linearly striped quantized regions so that each linearly striped discrete layer is interposed between any two adjacent linearly striped quantized regions, and to alternately arrange the above linearly striped quantized regions and linearly striped discrete layers so as to constitute a one-dimensional Fresnel lens. It is also possible to divide the above quantized region into a plurality of ring-shaped quantized regions in which the aggregate of the above semiconductor micro-needles is formed into rings in a plane parallel to the surface of the silicon substrate, to provide ring-shaped discrete layers for separating and insulating the above ring-shaped quantized regions so that each ring-shaped discrete layer is interposed between any two adjacent ring-shaped quantized regions, and to alternately arrange the above ring-shaped quantized regions and ring-shaped discrete layers so as to constitute a two- dimensional Fresnel lens.

It is also possible to arrange a plurality of the above quantized regions so as to form a specified flat pattern in the above silicon substrate, thereby constituting the semiconductor apparatus so that it functions as an optical display device.

It is possible to dispose an LSI provided with an additional self-checking circuit on the above silicon substrate and to provide the above quantized region in the self-checking circuit of the above LSI.

Next, to attain the above first object, a method of manufacturing the aggregate of semiconductor micro-needles according to the present invention comprises the steps of: forming on a silicon substrate a dotted mask for covering a large number of dot regions each having a diameter sufficiently small to cause the quantum size effects of the above semiconductor; and etching the above silicon substrate by using the above dotted mask so as to form a large number of semiconductor micro-needles each extending from the surface of the above silicon substrate to a specified depth.

In accordance with the method, there can be formed the aggregate of semiconductor micro-needles which exerts remarkable quantum size effects.

In the step of forming the above dotted mask, it is possible to deposit a large number of granular materials, each having a diameter sufficiently small to cause the quantum size effects of the above semiconductor, directly on the above silicon substrate so that the granular materials constitute the dotted mask. In accordance with the method, the aggregate of semiconductor micro-needles, which is different in structure from the conventional porous semiconductor, can be formed easily. It is also possible, in the step of forming the above dotted mask, to form a photoresist film on the above silicon substrate and then mechanically remove a part of the above photoresist film by means of a probe needle of a cantilever of an atomic force microscope so that the dot regions remain and that the remaining portions of the photoresist film constitute the above dotted mask. It is also possible to apply a photoresist onto the above silicon substrate and then pattern the above photoresist film so that dot-matrix-pattern portions resulting from the interference of light remain and that the above remaining portions of the photoresist film constitute the above dotted mask.

In the step of forming the above dotted mask, it is possible to form an insulating film on the above silicon substrate and to further form a pre-dotted mask for covering a large number of minute dot regions on the above insulating film so that the above insulating film is patterned using the pre-dotted mask and that the remaining portions of the insulating film constitute the above dotted mask.

As the above granular materials, it is possible to use grains of a semiconductor material, metal seeds serving as nuclei for the growth of the grains of a semiconductor material, a <311>-oriented silicon crystal, amorphous silicon, or the like.

After the formation of the above granular materials, it is possible to perform the step of annealing the above granular materials at least once so as to reduce the interface after the formation of the above granular materials. With the annealing step, each of the resulting granular materials presents an excellent configuration closer to a sphere.

Furthermore, in forming the above quantized region, it is also possible to perform the step of forming an insulating layer so as to surround each of the above semiconductor micro-needles. In accordance with the method, it is possible to prevent an impurity from entering into each semiconductor micro-needle as well as discharge the impurity out of the semiconductor micro-needle.

The step of forming the above insulating layer is preferably performed by filling up the space surrounding each of the above semiconductor micro-needles with the insulating layer. The step of forming the above insulating film can also be performed by CVD or by thermally oxidizing the surfaces of the semiconductor micro-needles.

To attain the above second object, a method of manufacturing the semiconductor apparatus according to the present invention comprises the steps of: forming on a silicon substrate a dotted mask for covering a large number of dot regions each having a diameter sufficiently small to cause the to quantum size effects of the above semiconductor; etching the above silicon substrate by using the above dotted mask so as to form a large number of semiconductor micro-needles each extending from the surface of the above silicon substrate to a specified depth; removing the above dotted mask; and forming an upper electrode electrically connected to each semiconductor micro-needle over the upper ends of the above semiconductor micro-needles.

In accordance with the method, a semiconductor apparatus with the advanced information processing function as described above can easily be manufactured.

It is possible to further provide the step of forming a p-n junction in the above silicon substrate and form, in the above step of forming an aggregate of semiconductor micro-needles, the semiconductor micro-needles by performing etching to a point at least lower than the above p-n junction. In accordance with the method, a p-n junction is formed in each semiconductor micro-needle, thereby enhancing the quantum size effects.

It is also possible to perform the step of forming a discrete insulating layer which surrounds the above aggregate of semiconductor micro-needles so that the aggregate of semiconductor micro-needles is laterally isolated from other regions. In this case, it is preferable to further perform the step of forming at least one lateral electrode to be connected to the silicon substrate through the above discrete insulating layer. In accordance with the method, it becomes possible to input and obtain an electric signal from the lateral side of the quantized region.

BRIEF DESCRIPTION OF THE DRAWINGS

FIG. 13 is a view showing a difference in the grain distribution and grain diameter between the case where a surface treatment was performed and the case where the surface treatment was not performed in the fourth embodiment;

FIG. 16 is a cross sectional view of a semiconductor apparatus according to a seventh embodiment;

FIGS. 17(a) and 17(b) is a view diagrammatically showing the plane structure of a one-dimensional Fresnel lens and the plane structure of a two-dimensional Fresnel lens;

FIG. 20 is a cross sectional view of a semiconductor apparatus according to a ninth embodiment;

FIGS. 21(a) to 21(c) are cross sectional view showing the transition of the structure of the semiconductor apparatus according to the ninth embodiment during its manufacturing process;

FIGS. 25(a-1) to 25(d-2) are cross sectional views and plan views showing the transition of the structure of the semiconductor apparatus according to an eleventh embodiment during its manufacturing process;

DETAILED DESCRIPTION OF THE PREFERRED EMBODIMENTS

Below, the embodiments of the present invention will be described with reference to the drawings.

(First Embodiment)

Figure 1:
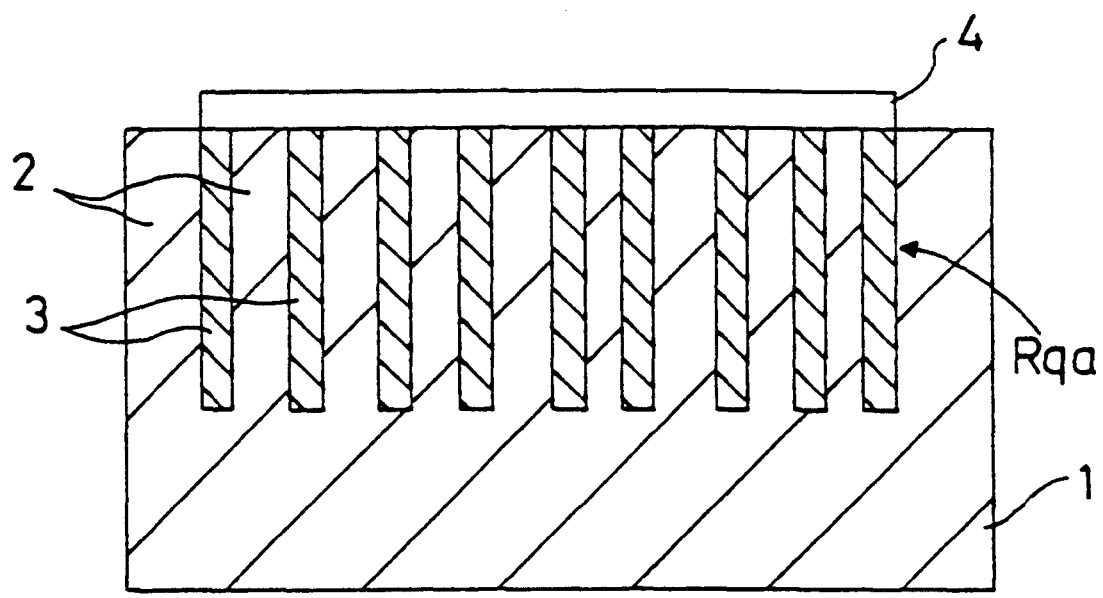
FIG. 1 is a cross sectional view of a semiconductor apparatus according to a first embodiment.

A description will be given first to a first embodiment. FIG. 1 is a cross-sectional view of an optical semiconductor apparatus according to the first embodiment. As shown in the drawing, the semiconductor apparatus comprises: a silicon substrate 1 of single-crystal structure; a large number of semiconductor micro-needles 2 extending from the surface of the silicon substrate 1 to a specified depth so that the axial direction thereof is perpendicular to the surface of the substrate 1; an insulating layer 3 composed of a silicon dioxide film which fills up the space surrounding each semiconductor micro-needle 2; and a transparent electrode 4 formed on the flattened top ends of the semiconductor micro-needles 2 and the insulating layer 3. An aggregate of the foregoing semiconductor micro-needles 2 functions as a quantized region Rqa. Those ends of the above semiconductor micro-needles 2 which are closer to the substrate 1, hereinafter referred to as "base ends," are held in combination by the substrate 1. Each semiconductor micro-needle 2 has a diameter of about 2 to 50 nm. The above insulating layer 3 is formed by subjecting the surface region of silicon constituting each semiconductor micro-needle 2 to thermal oxidation. Since the above transparent electrode 4 is in contact with the top end of each semiconductor micro-needle 2, it is electrically connected to each semiconductor micro-needle 2. Therefore, if a specified voltage is applied between the transparent electrode 4 and the silicon substrate 1 connected to the base ends of the semiconductor micro-needles 2 or if the quantized region Rqa is irradiated with light, light emission is caused in each of the semiconductor micro-needles 2 by the quantum size effects, thereby generating electroluminescence and photoluminescence.

Next, a description will be given to a method of manufacturing the optical semiconductor apparatus. FIGS. 2(a) to 2(e) are cross-sectional views showing the transition of the structure of the optical semiconductor apparatus during its manufacturing process.

Figure 2:
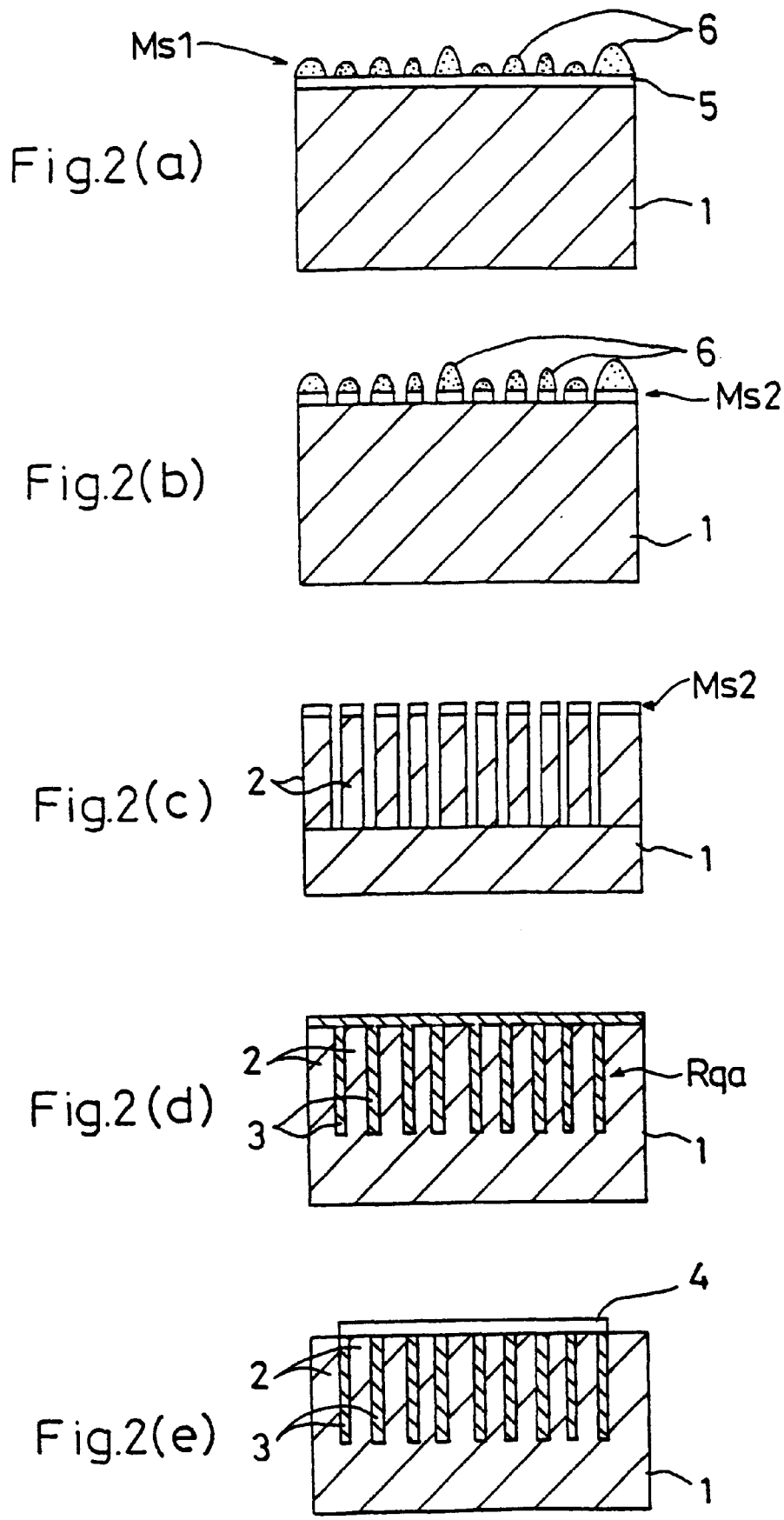
FIGS. 2(a) to 2(e) are cross sectional views showing the transition of the structure of the semiconductor apparatus according to the first embodiment during its manufacturing process.

First, as shown in FIG. 2(a), a top insulating film 5 composed of a silicon dioxide film, a silicon nitride film, or the like is formed on the silicon substrate 1 by thermal oxidation, CVD, or a like method. Thereafter, hemispherical grains 6 made of silicon are deposited thereon by LPCVD. In this case, if a He-based 20% $SiH_4$ gas is used as a raw material and a flow rate is set to 300 ccm, the hemispherical grains with a radius of several nanometers as shown in the drawing can be obtained.

In producing the hemispherical grains 6, it is also possible to use a $SiH_4$ gas in an atmosphere of hydrogen gas. In this case, it becomes particularly easy to control the deposition of the hemispherical grains B.

Next, as shown in FIG. 2(b), the top insulating film 5 composed of a silicon dioxide film or a silicon nitride film is etched, using a first dotted mask Ms1 consisting of the large number of hemispherical grains 6, so as to form a second dotted mask Ms2 composed of the remaining portions of the top insulating film 5, which has been patterned into stripes corresponding to the pattern of the large number of hemispherical grains 6. The etching of the top insulating film 5 on the silicon substrate 1 is conducted, e.g., in an atmosphere of mixed gases of CF4/CHF3=30/40 sccm under a pressure of 1 Pa with an RF power of 400 W. After that, each hemispherical grain 6 is etched away.

Next, as shown in FIG. 2(c), the silicon substrate 1 is etched to a specified depth, using the second dotted mask Ms2 patterned in stripes, so as to form a large number of semiconductor micro-needles 2 perpendicular to the surface of the silicon substrate 1. The etching is conducted in an atmosphere of mixed gases of C12/O2=90/3 sccm under a pressure of 1 Pa with an RF power of 200 W. The side portions of each semiconductor micro-needle 2 are substantially vertical to the surface of the silicon substrate 1 and stand substantially upright. As will be described later, if the hemispherical grains 6 are formed under appropriate conditions, the semiconductor micro-needles 2 can be formed independently of each other with no linkage.

Then, as shown in FIG. 2(d), the side portions of the semiconductor micro-needles 2 are covered with an insulating layer 3 composed of a silicon dioxide film so as to fill up the space surrounding each semiconductor micro-needle 2, followed by the flattening of the top ends thereof.

Furthermore, as shown in FIG. 2(e), the flattened portion of the insulating layer 3 which covers the top ends of the semiconductor micro-needles 2 is removed so as to form the transparent electrode 4 thereon.

In the above first embodiment, the top insulating film 5 and the first dotted mask Ms1 are successively formed on the silicon substrate 1 and then the second dotted mask Ms2 is formed from the top insulating film 5, so that the silicon substrate 1 is etched using the second dotted mask Ms2. However, it is also possible to form the semiconductor micro-needles 2 by forming the first dotted mask Ms1 directly on the silicon substrate 1 and then etching the silicon substrate 1, using the first dotted mask Ms1.

Figure 4A:
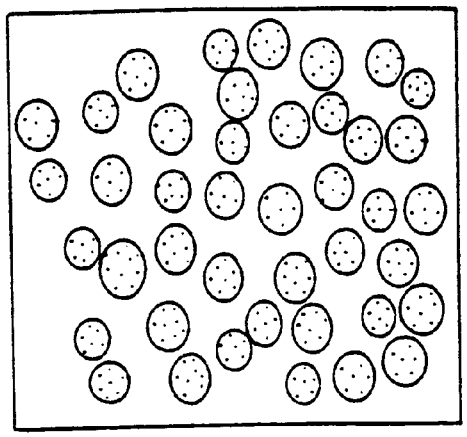
FIGS. 4(a) to 4(c) are transverse sectional views showing the structure of an aggregate of semiconductor microneedles formed using grains in the amorphous region by a manufacturing method of the first embodiment, the structure of an aggregate of semiconductor micro-needles formed using grains in the <311>-oriented region by the manufacturing method of the first embodiment, and the structure of conventional porous silicon formed by anodization, respectively.
Figure 4B:
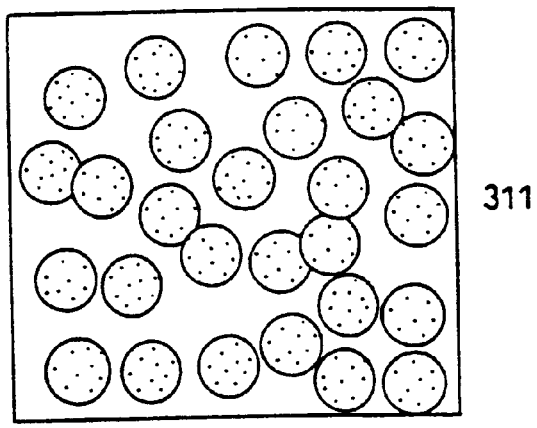
Figure 4C:
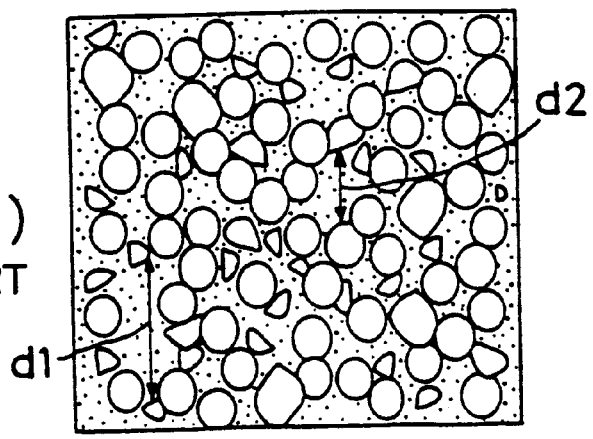

Next, a description will be given to the operation of the optical semiconductor apparatus thus constituted. Here, the region in which the semiconductor micro-needles 2 are formed from the surface to a specified depth of the p-type silicon substrate 1 serves as the quantized region Rqa. When a voltage of 20 V is applied in the forward direction to the transparent electrode 4 electrically connected to the semiconductor micro-needles 2, while setting the silicon substrate 1 to the ground potential, visible electroluminescence is observed at room temperature. In the case of using silicon, since the electrons excited by the application of a voltage or the like generally undergo indirect transitions, most of the energy resulting from the transition is converted into heat, so that light emission in the visible region has been considered difficult. However, since the quantized region Rqa composed of silicon is constituted by the aggregate of semiconductor micro-needles 2 each having a radius of several nm in the above first embodiment, the band width of silicon is expanded from 1.2 eV to 2.5 eV due to the quantum size effects, while the excited electrons undergo direct transitions, thereby causing the emission of visible light due to the direct transitions between the bands. Moreover, compared with the conventional porous silicon formed by anodization, the aggregate of silicon micro-needles 2 as used in the above first embodiment provides a high light emission intensity and a sharp emission spectrum. Below, the reason for the advantages of the quantized region in the present embodiment over the conventional one will be deduced from a difference in structure therebetween. FIG. 4(a) shows the transverse sectional structure of the grains used in the above manufacturing process in the case where they are made of amorphous silicon. FIG. 4(b) shows the transverse sectional structure of the grains used in the above manufacturing process in the case where they are made of <311>-oriented single- crystal silicon. Different conditions under which these structures are formed will be described later. FIG. 4(c) shows the transverse sectional structure of the conventional porous silicon formed by anodization. As shown in FIG. 4(c), since the conventional porous silicon is formed by anodization which renders silicon porous by primarily using micro-pores in the dioxide film resulting from the anode oxidation of silicon, a silicon wall is formed in the porous silicon. The thickness of the silicon wall, i.e., the distance d between two adjacent micro-pores on both sides of the silicon wall varies greatly from one portion to another (see distances d1 and d2 in the drawing). It may be considered that, if the distance d between two adjacent micro-pores on both sides is excessively large (as with d2 in the drawing), the quantum size effects cannot be caused. By contrast, since the semiconductor micro-needles 2 in the present invention form substantially discrete stripes in transverse section, as shown in FIGS. 4(a) and 4(b), it can be considered that they have sufficiently small dimensions to cause the quantum size effects, though their diameters may differ slightly depending on their directions. Consequently, a higher light emission intensity and a sharper emission spectrum can be obtained.

Figure 5:
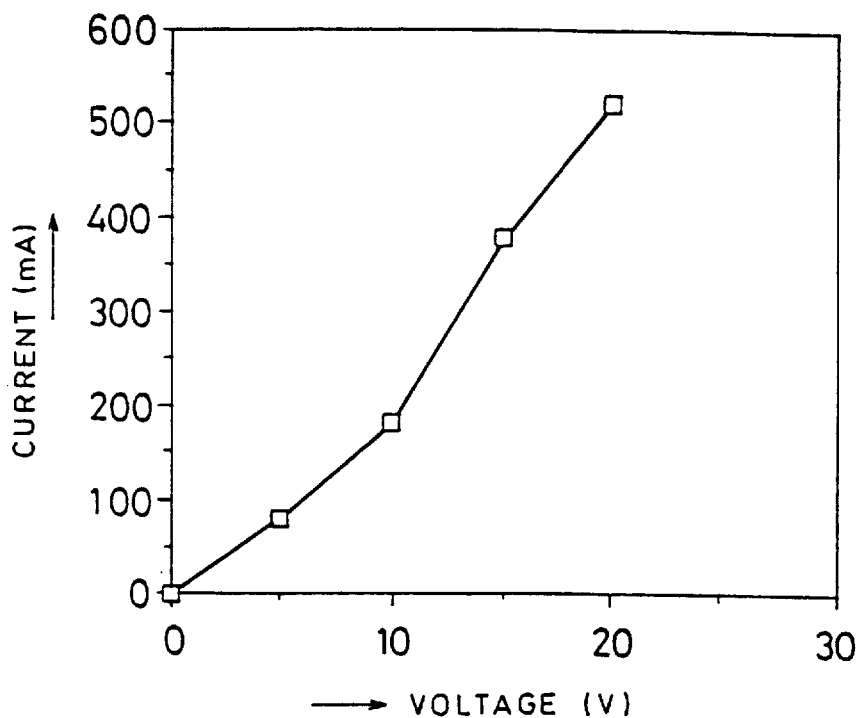
FIG. 5 is a view showing the characteristics of current with respect to voltage applied to a quantized region.
Figure 6:
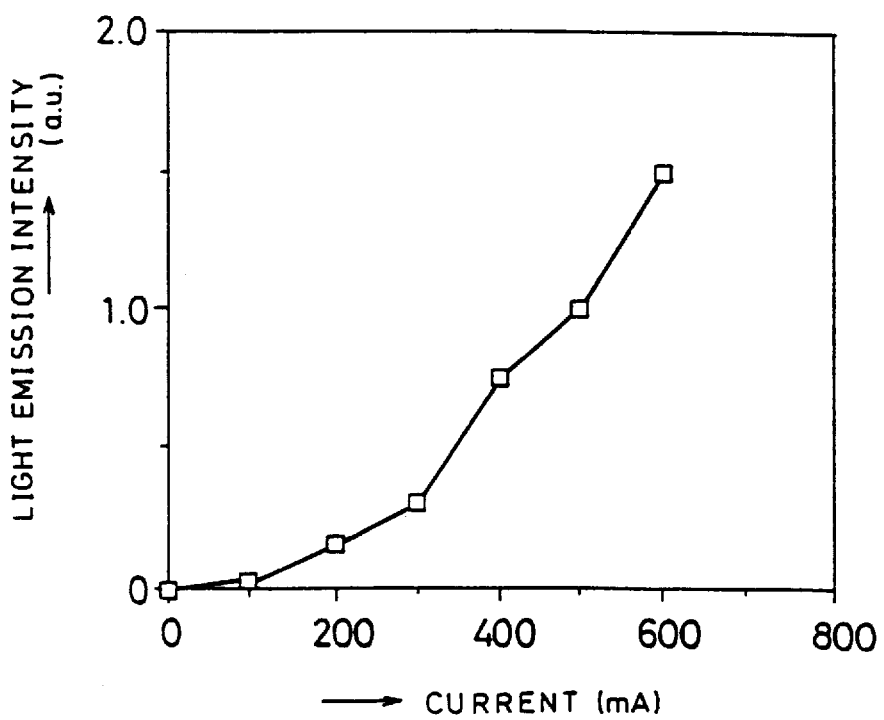
FIG. 6 is a view showing the dependence of light emission intensity on current in the quantized region.
Figure 7:
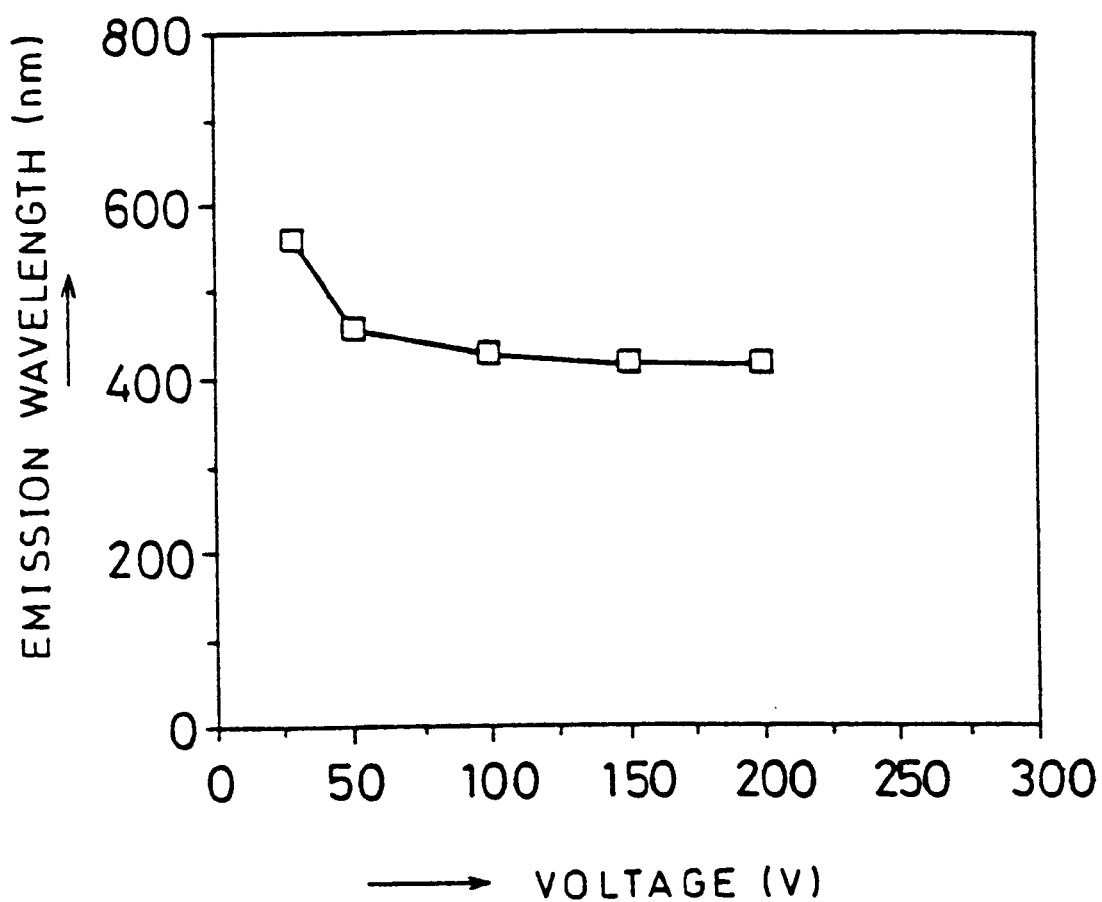
FIG. 7 is a view showing the dependence of emission wavelength on voltage in the quantized region.
Figure 8:
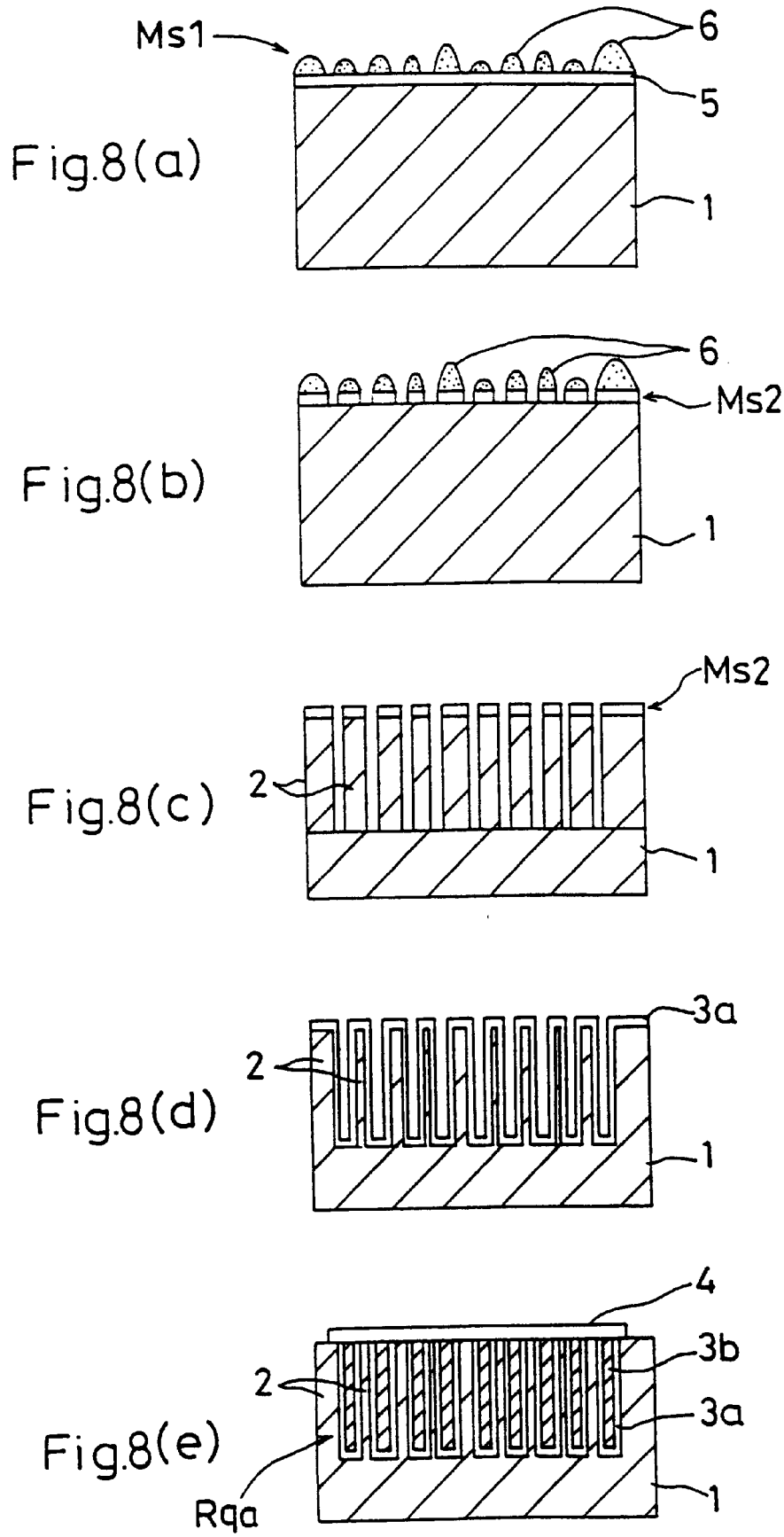
FIGS. 8(a) to 8(e) are cross sectional views showing the transition of the structure of the semiconductor apparatus according to a second embodiment during its manufacturing process.

FIG. 5 shows the characteristics of the current (injected current) flowing through the aggregate of semiconductor micro-needles 2 with respect to the voltage applied to the transparent electrode 4. FIG. 6 shows the light emission intensity of electroluminescence with respect to the injected current in the aggregate of semiconductor micro-needles 2. It will be appreciated from FIGS. 5 and 6 that the light emission intensity increases with an increase in the voltage applied to the transparent electrode 4. FIG. 7 shows the characteristics of the light emission intensity with respect to the voltage for carrier injection. It will be appreciated from FIG. 7 that color display elements corresponding to light emission in individual colors such as red, blue, and yellow can be formed by varying the voltage for carrier injection.

As shown in FIGS. 2(a) to 2(e), the first embodiment has adopted, in forming the quantized region Rqa composed of the aggregate of semiconductor micro-needles 2 of single-crystal silicon each having a radius of several nanometers, the same processing method as used in the process of manufacturing a normal semiconductor apparatus such as a MOSFET. That is, the space surrounding each semiconductor micro-needle 2 is filled with the oxide film 3, so that the top ends thereof are flattened and that the transparent electrode 4 is electrically connected to the quantized region. Therefore, the process used in the first embodiment is interchangeable with the conventional process of producing a silicon wafer for manufacturing a normal semiconductor apparatus, so that a conventional semiconductor apparatus such as a normal MOSFET can be produced after producing the optical semiconductor apparatus according to the present invention.

Next, a detailed description will be given to the conditions in each step of the manufacturing process for the above optical semiconductor apparatus.

The method of forming the grains in the step shown in FIG. 2(a) has been reported since 1990 to increase the capacity of a DRAM. For example, such a method is disclosed in: Ext. Abs. 22nd SSDM (1990) pp.869–872 by Y. Hayashide et al.; J. Appl. Phys. 71(1991) pp.3538–3543 by H. Watanabe et al.; and Tech. Dig. of VLSI Symp (1991) pp.6–7 by H. Itoh et al. By adopting these methods, the grains can be formed easily.

Figure 3:
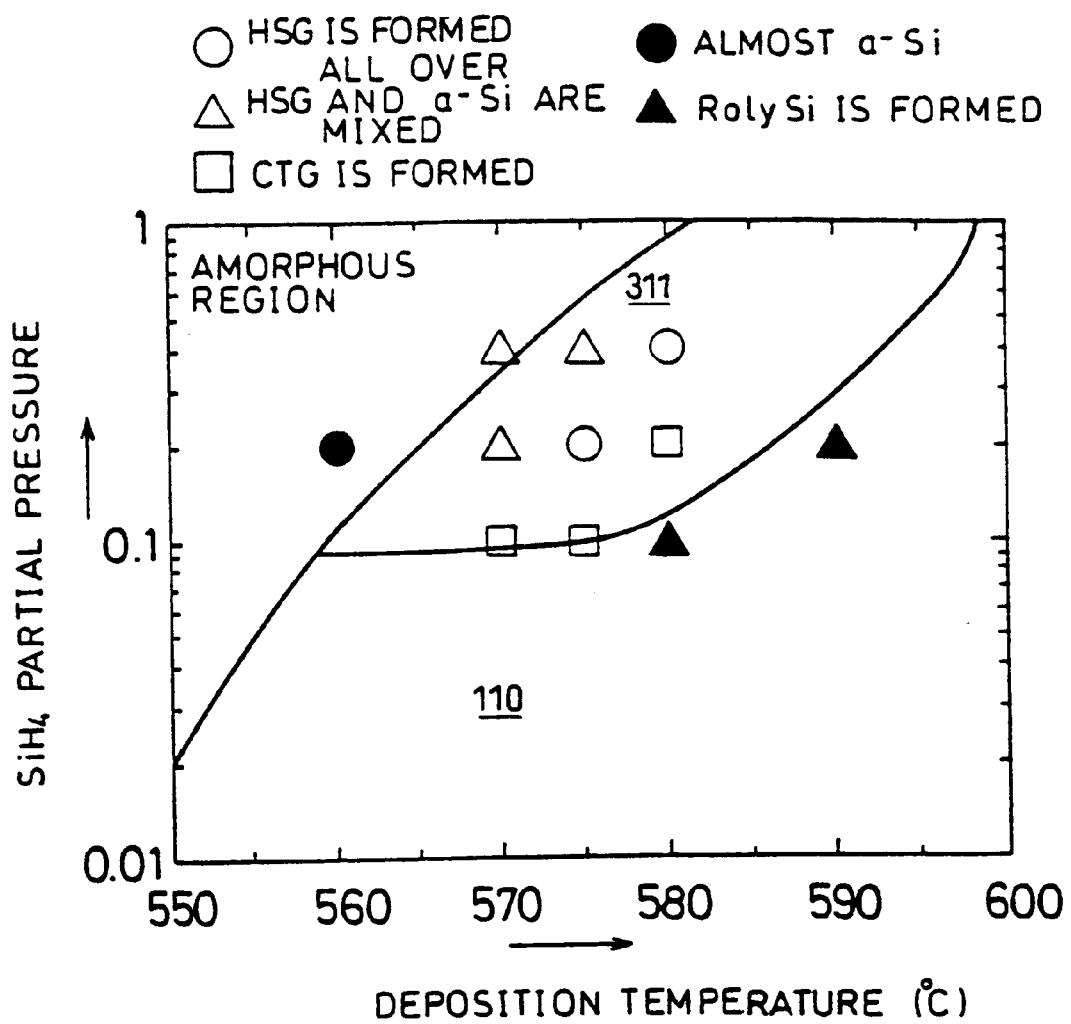
FIG. 3 is a view showing variations in the configuration of a hemispherical grain when the deposition temperature and the partial pressure of $SiH_4$ are varied in the first embodiment.

FIG. 3 shows variations in the configuration of the grain when the deposition temperature and the partial pressure of $SiH_4$ are varied at a constant gas flow rate of 300 ccm. The graph inserted in the drawing is a map showing conditions under which silicon crystal phases are formed, which consists of: an amorphous region in which amorphous silicon is formed as grains; a <311>-oriented region in which single-crystal silicon having the <311> orientation perpendicular to the substrate surface is formed as grains; and a <110>-oriented region in which single-crystal silicon having the <110> orientation perpendicular to the substrate surface is formed as grains.

In terms of the structure of the resulting grains, the following three regions are important:

1. A HSG-aSi region in which hemispherical grains (HSG) and amorphous silicon (aSi) are mixed;
2. A HSG region in which hemispherical grains are formed all over; and
3. A CTG region where several grains combine to form a cylindrical trained grain (CTG) in the form of a crest when viewed from the surface.

The observation of the three regions has led to the following findings:

(1) The HSG region exists in the <311>-oriented region where grains were formed at a temperature within a range of 570° C. to 580° C. under a $SiH_4$ partial pressure (formation pressure) within a range of 0.5 Torr to 2.0 Torr;
(2) The HSG-aSi region exists in the vicinity of the boundary between the amorphous region and the <311>-oriented region;
(3) The CTG region exists mainly in the vicinity of the boundary between the <311>-oriented region and the <110>-oriented region;
(4) The HSG region exists in that area of the above <311>-oriented region which is interposed between the above two regions (the HSG-aSi region and the CTG region);
(5) As the grains become closer to amorphous silicon in terms of structure, the grains increase in size accordingly. As the grains become closer to the <110> orientation in terms of structure, on the other hand, the grains decrease in size accordingly;
(6) The amorphous region expands increasingly as the partial pressure of $SiH_4$ (formation pressure) increases;
(7) Different grain sizes result from different densities of nuclei for the growth of the grains (metal such as Ni or W) on the film surface; and
(8) Consequently, if grains are deposited at a deposition temperature of 560° C. to 590° C. with a $SiH_4$ partial pressure of 0.1 to 0.4 Torr, grains in the form of hemispheres and grains in the form of crests are obtained at a surface density of 0.4 to 0.7.

In the above embodiment, the side portions of the semiconductor micro-needles 2 made of single-crystal silicon are subjected to thermal oxidation so as to fill up the space surrounding each semiconductor micro-needle 2 with the insulating layer 3 composed of a silicon dioxide film. However, the present invention is not limited to the above embodiment. Even when the insulating layer is not provided, light emission due to the quantum size effects is generated. However, if the side portions of each semiconductor micro-needle 2 is covered with the insulating layer 3 formed by thermal oxidation, the following advantages can be obtained. That is, not only impurities and foreign substances, which have been generated from the etching of the silicon substrate 1 in the formation of the semiconductor micro-needles 2 and attached to the side portions thereof, can be locked in the insulating layer 3, but also these impurities and foreign substances can be prevented ever after from entering into the quantized region Rqa composed of the aggregate of semiconductor micro-needles 2 of single-crystal silicon. Since the quantized region Rqa is protected from the intrusion of these impurities and foreign substances, influences of the atoms and molecules attached to the side portions of the semiconductor micro-needles 2 can be eliminated, so that a uniform wavelength can be constantly reproduced as required, thereby providing a semiconductor apparatus, such as a silicon light-receiving/light-emitting element, with a long lifespan.

The insulating layer 3 made of silicon dioxide or silicon nitride does not necessarily fill up the space surrounding each semiconductor micro-needle 2, either, as in the first embodiment. Even when the insulating layer 3 is formed only in the vicinity of the surfaces of semiconductor micro-needles 2, the functions of locking impurities and preventing their intrusion can be implemented. However, if the space surrounding each semiconductor micro-needle 2 is filled with the insulating layer 3 as in the first embodiment, a short circuit between the semiconductor micro-needles 2 can surely be prevented as well as the top ends of the semiconductor micro-needles 2 can be flattened without impairing the configuration thereof. Consequently, an electrical connection can surely be provided between the semiconductor micro-needles 2 and the transparent electrode 4.

(Second Embodiment)

Next, a description will be given to a second embodiment. FIGS. 8(a) to 8(e) illustrate the process of manufacturing the optical semiconductor apparatus according to the second embodiment. The manufacturing process used in the second embodiment is substantially the same as the manufacturing process used in the above first embodiment, except that the conditions under which the hemispherical grains 6 are deposited by LPCVD are changed and that the space surrounding each semiconductor micro-needle 2 is filled up with a silicon dioxide film 3b formed by CVD or the like after the side portions of the semiconductor micro-needles 2 were covered with a thermal oxidation film 3a, followed by the flattening of their surface regions. In other words, these two types of oxide films 3a and 3b constitute an insulating layer 3.

Figure 9:
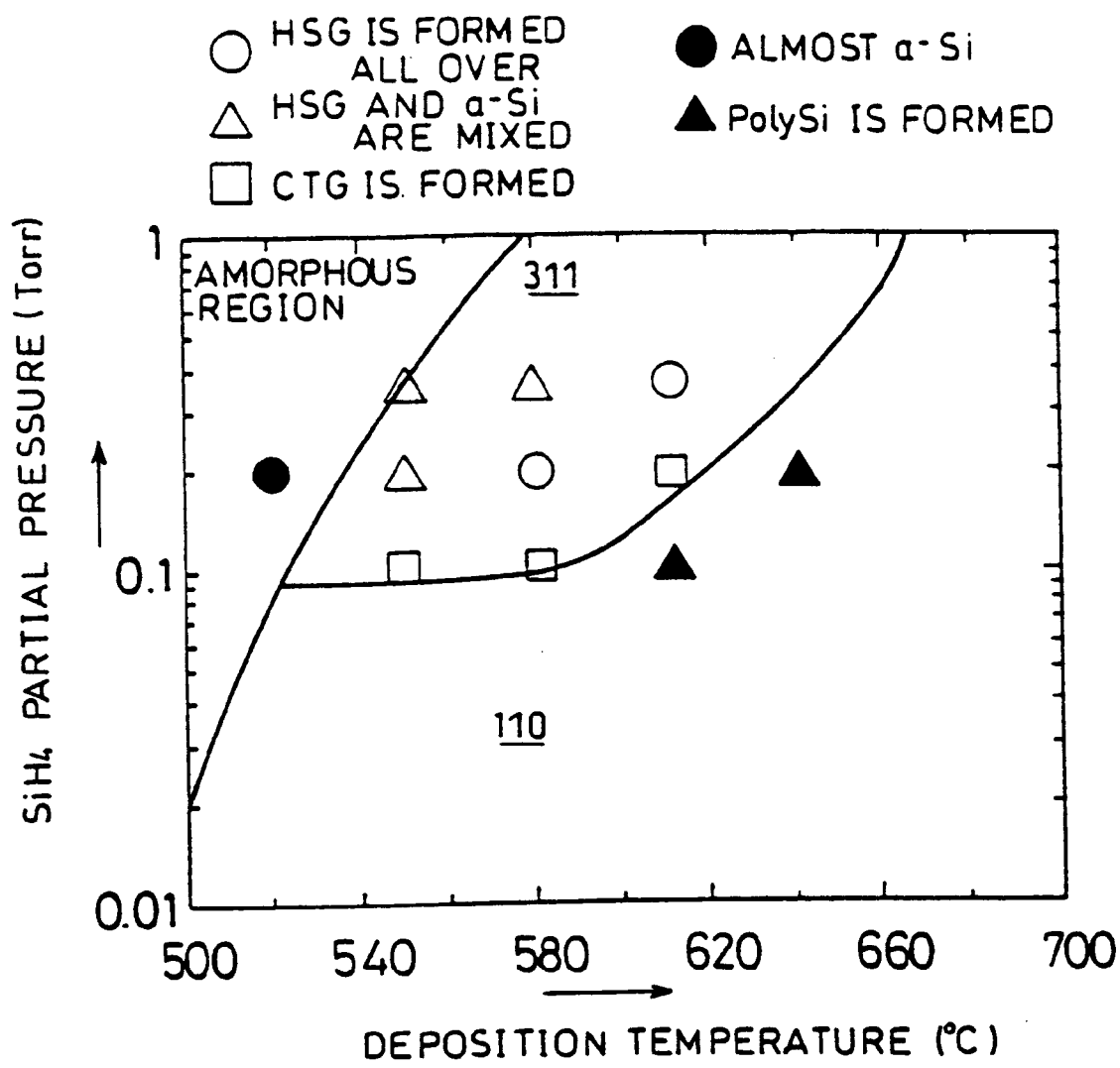
FIG. 9 is a view showing variations in the configuration of the hemispherical grain when the deposition temperature and the partial pressure of $SiH_4$ are varied in the second embodiment.

In the step of depositing the hemispherical grains 6, a He-based 15% $SiH_4$ gas is used as a raw material so as to deposit the hemispherical grains 6 under the conditions of gas flow rate of 100 ccm, deposition temperature of 500° C. to 700° C., and $SiH_4$ partial pressure of 0.1 to 0.4 Torr. If the gas flow rate and the deposition rate are set lower, the deposition can be accomplished at a lower deposition temperature. FIG. 9 shows variations in the configuration of the hemispherical grain 6 when the deposition temperature and the $SiH_4$ partial pressure are varied at a constant gas flow rate of 100 ccm. The map showing the conditions of FIG. 3 can be divided into the three regions of: (1) HSG-aSi region; (2) HSG region; and (3) CTG region depending on the configuration of the resulting grain, similarly to the first embodiment.

The observation of the three regions has led to the following findings:

(1) The HSG region can be obtained at a temperature of 500° C. to 650° C. under a $SiH_4$ partial pressure of 0.1 Torr to 0.4 Torr.

In addition to this, the same tendencies as described in (2) to (7) of the above first embodiment can be recognized.

(8) From the foregoing, it can be concluded that the proper hemispherical grains 6 can be obtained in a wider range of deposition temperature than in the above first embodiment.

Hence, in the present second embodiment, the range of the appropriate deposition temperature can be expanded by changing the ratio of $SiH_4$ to the He base in the raw material gas and by changing the gas flow rate. The space surrounding each semiconductor micro-needle 2 can more satisfactorily be filled with the oxide film 3b or nitride film formed by CVD than only with the thermal oxidation film as in the first embodiment.

Although the thermal oxidation film 3a is formed prior to the formation of the silicon dioxide film 3b in the above second embodiment, the present invention is not limited to the above embodiment. It is also possible to form the whole insulating film 3b by CVD for the convenience of the process.

In this case, if the whole insulating layer 3 is composed only of silicon dioxide, light emission in a lateral direction can be obtained, since the refractive index of silicon dioxide is small. If the whole insulating layer 3 is composed only of silicon nitride, on the other hand, a difference in coefficient of thermal expansion between silicon nitride and silicon imparts a compressive strain to the semiconductor micro-needles 2, so that the quantum size effects can be exerted more remarkably. The same effects can be achieved by forming a silicon nitride film in place of the silicon dioxide film 3b formed by CVD in the present embodiment.

(Third Embodiment)

Figure 11:
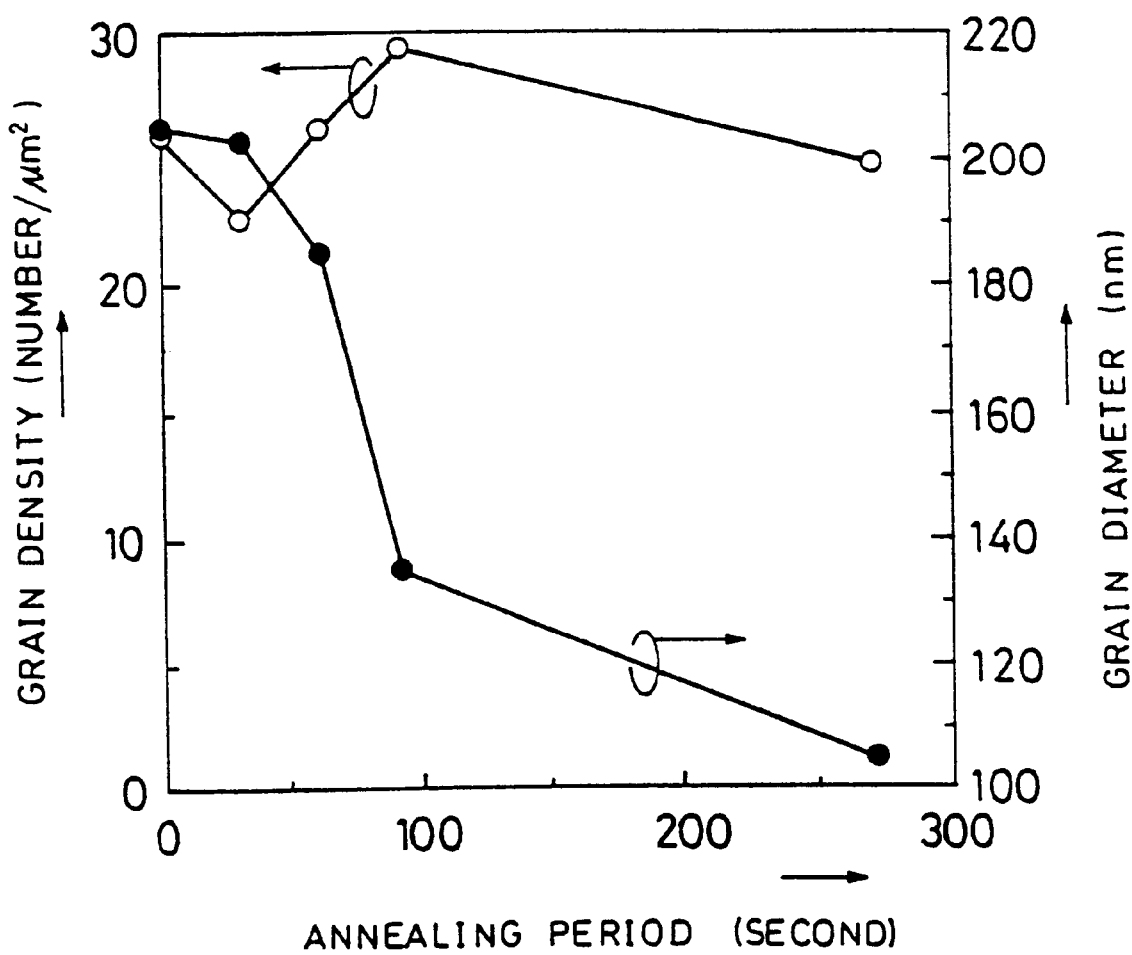
FIG. 11 is a view showing the relationship between the annealing period and the grain diameter and density of the hemispherical grains in a third embodiment.

Next, a description will be given to a third embodiment for improving the configuration of the hemispherical grain 6. After the hemispherical grains 6 are formed by substantially the same manufacturing process as that of the above first embodiment, the $SiH_4$ gas in a tube is evacuated, followed by annealing while introducing $N_2$ gas, which is an inactive gas, into the tube. FIG. 11 shows the relationship between the annealing period and the grain diameter and density. It will be appreciated that the grain diameter decreases with an increase in annealing period. Since the surface and interface tend to shrink with a decrease in grain diameter, the configuration of the grain becomes closer to a hemisphere, resulting in a high increase rate of the surface area of the grain. If the annealing period becomes 2 minutes or longer, the region with no hemispherical grain expands. The increasing difficulty with which the hemispherical grains 6 are formed can be attributed to the increasing degree of surface oxidization due to annealing, which interferes with the growth of grains on the surface. Furthermore, two-step annealing can be performed under two sets of conditions with different partial pressures of oxygen, thereby making the grain diameter of the hemispherical grains 6 more uniform.

Figure 10A:
FIGS. 10(a) to 10(c) are SEM photographs showing variations in the configurations of the hemispherical grains when annealing conditions are varied.
Figure 10B:
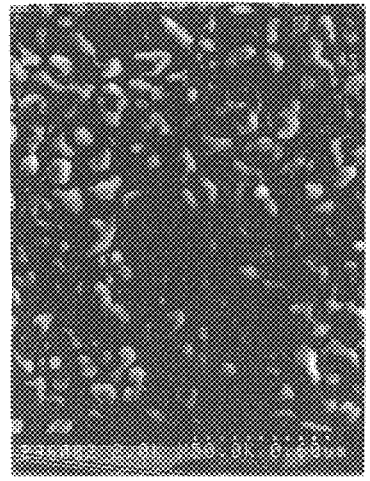
Figure 10C:
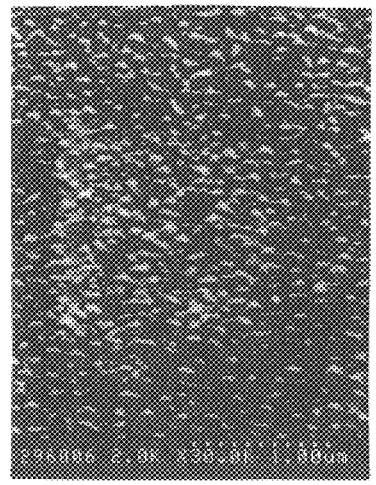

FIGS. 10(a) to 10(c) are SEM photographs of hemispherical grains taken when common film-forming conditions (a temperature of 575° C., a pressure of 1.0 Torr, and a 20% $SiH_4$ gas flow rate of 300 sccm) and the same annealing temperature (575° C.) are adopted, while the other annealing conditions are varied. FIG. 10(a) shows hemispherical grains obtained when annealing was conducted in an atmosphere of $N_2$ under a pressure of 1.0 Torr for 30 minutes immediately after the film formation. FIG. 10(b) shows hemispherical grains obtained when annealing was conducted in vacuum (about 0.01 Torr) for 2 minutes after the film formation and then continued under a pressure of 0.14 Torr for 10 minutes. FIG. 10(c) shows hemispherical grains obtained when annealing was conducted in vacuum (about 0.01 Torr) for 5 minutes after the film formation and then continued in an atmosphere of $N_2$ under a pressure of 1.0 Torr for 30 minutes.

After the formation of the hemispherical grains 6, semiconductor micro-needles 2, the insulating layer 3, the transparent electrode 4 and the like are formed in substantially the same process as used in the above first embodiment.

Since the present third embodiment has reduced the diameter of the hemispherical grain 6 by annealing and has improved the configuration thereof so that it becomes closer to a hemisphere, semiconductor micro-needles 2 with a substantially uniform radius can be formed in a plane in the vicinity of the surface of the silicon substrate 1. Moreover, since the radius of semiconductor micro-needles 2 constituting the quantized region becomes uniform, the emission spectrum becomes sharper, while the light emission intensity increases.

(Fourth Embodiment)

Figure 12A:
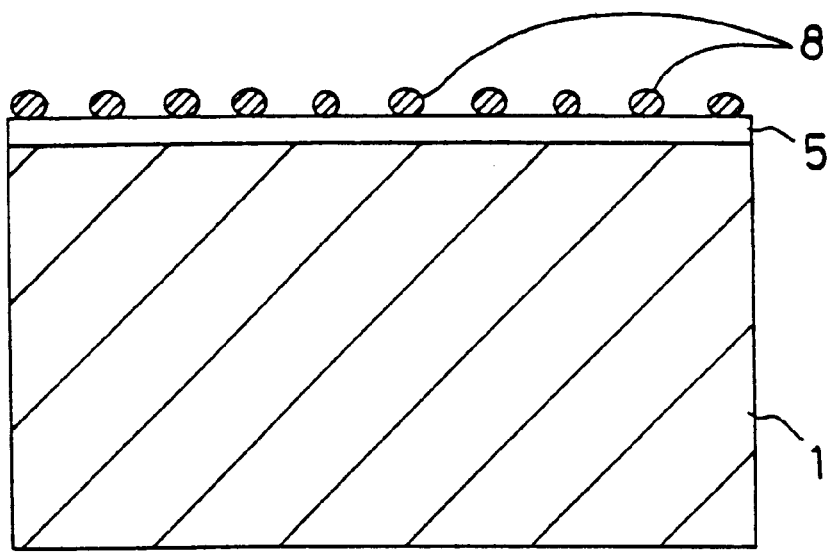
FIGS. 12(a) and 12(b) are cross sectional views showing the transition of the grains according to a fourth embodiment during their formation process.
Figure 12B:
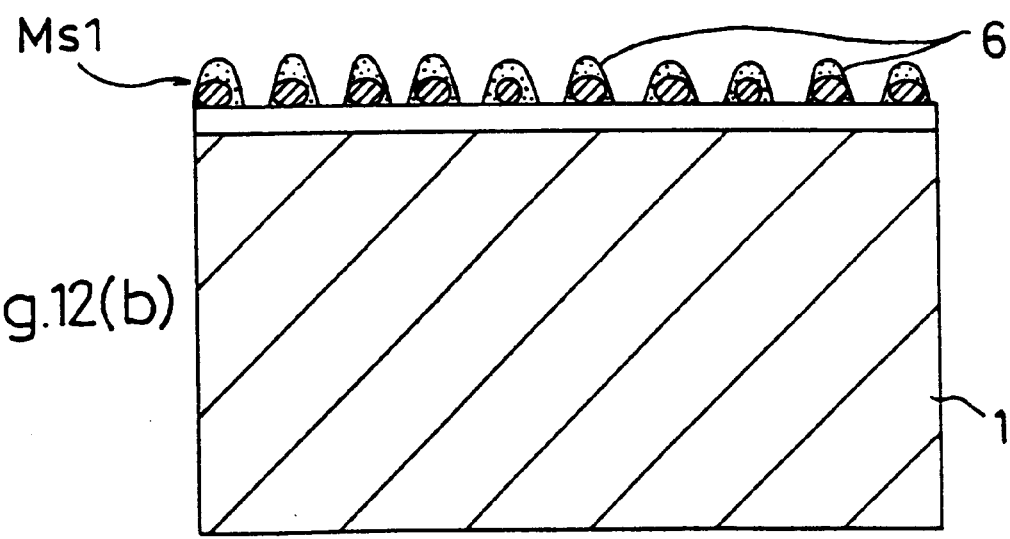

Next, a description will be given to a fourth embodiment. FIGS. 12(a) and 12(b) are cross sectional views for illustrating the procedure of forming the hemispherical grains in the fourth embodiment.

First, as shown in FIG. 12(a), crystal growth nuclei 8 serving as nuclei for the crystal growth of grains are formed on the top insulating film 5 on the silicon substrate 1. The crystal growth nuclei 8 are made of metal such as tin or rhodium. To form the nuclei, the silicon substrate 1 with the top insulating film 5 deposited thereon is immersed in a surface treatment solution at ordinary temperature for 1 minute, followed by washing and drying. As the surface treatment solution, a solution for use in plating is used.

Next, as shown in FIG. 12(b), using these crystal growth nuclei 8, the hemispherical grains 6 of silicon are grown on the top insulating film 5 by LPCVD. As a raw material, a He-based 15% $SiH_4$ gas is used at a gas flow rate of 100 ccm. The deposition is conducted at a deposition temperature of 500 to 700° C. under a $SiH_4$ partial pressure of 0.1 to 0.4 Torr. Under these conditions, the silicon grains 6 are selectively deposited over the crystal growth nuclei 8 so as to form the first dotted mask Ms1 consisting of a large number of silicon granular materials 6.

Then, in accordance with the same process as that of the first embodiment (see FIGS. 2(c) to 2(e)), the hemispherical grains, insulating layer, transparent electrode and the like are formed.

FIG. 13 is a view showing for comparison the distribution and diameter of the grains when the surface treatment, as shown in FIG. 12(a), was performed and the distribution and diameter of the grains when the surface treatment was not performed. Without the surface treatment, the mean value of the grain diameter is 110 □ and the maximum grain diameter is more than 200 □. With the surface treatment, on the other hand, the mean value of the grain diameter is 60 □ and the maximum grain diameter is 120 □ or less. Thus, with the surface treatment for forming the crystal growth nuclei 8 prior to the formation of the grains, the distribution and size of the hemispherical grains 6 become uniform, resulting in a uniform distribution of the grains in a plane. Since the radius and distribution of the semiconductor micro-needles 2 constituting the quantized region become uniform accordingly, the emission spectrum becomes much sharper, while the light emission intensity increases uniformly in the plane.

In the silicon light receiving element thus constituted, a negative voltage is applied to the p-type silicon substrate 1 so as to set the top end of each semiconductor micro-needle at the ground potential, followed by the irradiation of the aggregate of semiconductor micro-needles (quantized region) with light from a high-pressure mercury lamp as a light source. As a result of the irradiation with light, the resistance value of the quantized region containing the semiconductor micro-needles is changed, so that the apparatus can be used as a light receiving element.

(Fifth Embodiment)

Figure 14:
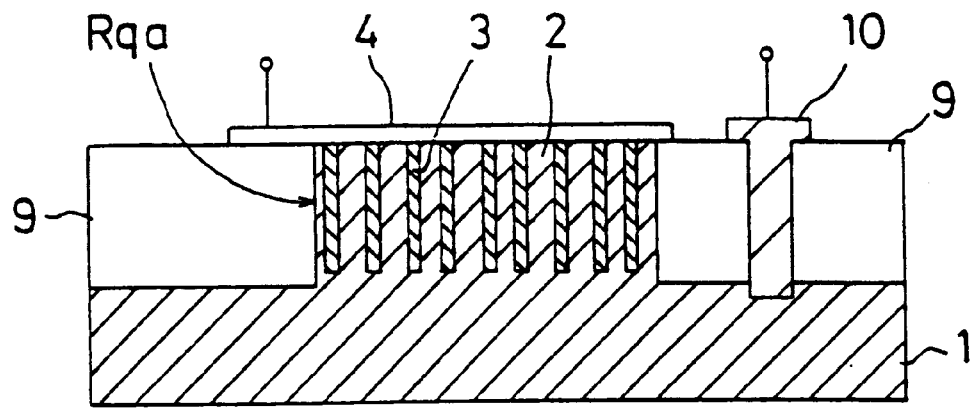
FIG. 14 is a cross sectional view of a semiconductor apparatus according to a fifth embodiment.

Next, a description will be given to a fifth embodiment. FIG. 14 is a cross sectional view of the optical semiconductor apparatus according to the fifth embodiment. The basic structure of the optical semiconductor apparatus shown in FIG. 14 is substantially the same as that of the first embodiment shown in FIG. 1, except that the quantized region Rqa on the silicon substrate 1 is laterally isolated from other regions by a discrete insulating layer 9. The depth of the discrete insulating layer 9 is larger than the depth h of the semiconductor micro-needle 2. In addition, apart from the transparent electrode 4 over the semiconductor micro-needles 2, a lateral electrode 10 is formed so as to penetrate the discrete insulating layer 9. The lateral electrode 10 is connected to the silicon substrate 1 functioning as a lower electrode with respect to the transparent electrode 4 functioning as an upper electrode of the semiconductor micro-needles 2.

A description will be given to the operation of the optical semiconductor apparatus thus constituted. If a voltage (e.g., about 50 Volt) is applied between the transparent electrode 4 and the lateral electrode 10, a potential difference is generated between the top end and base end of each semiconductor micro-needle 2 in the quantized region Rqa, so that visible electroluminescence is caused at room temperature by the same quantum size effects as those obtained in the first embodiment. In the present fifth embodiment, the voltage for carrier injection is varied from 25 to 200 Volt so that visible electroluminescence corresponding to individual light emission in red, blue, and yellow is observed. With the provision of the lateral electrode 10 as in the present fifth embodiment, it becomes particularly easy to transmit signals between the quantized region Rqa of the optical semiconductor apparatus and the outside.

(Sixth Embodiment)

Figure 15:
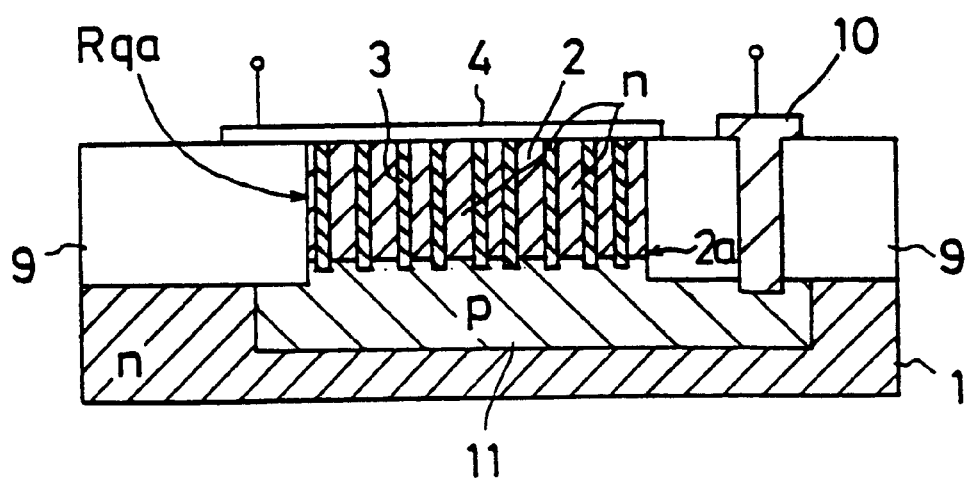
FIG. 15 is a cross sectional view of a semiconductor apparatus according to a sixth embodiment.

Next, a description will be given to a sixth embodiment. FIG. 15 is a cross sectional view of the optical semiconductor apparatus according to the sixth embodiment. The basic structure of the optical semiconductor apparatus shown in FIG. 15 is substantially the same as that of the above fifth embodiment shown in FIG. 14, except that the sixth embodiment uses the n-type silicon substrate 1 in which a p-well 11 is partially formed and that the region extending from above the p-well 11 to the surface of the silicon substrate 1 is doped with an n-type impurity. Each semiconductor micro-needle 2 in the quantized region Rqa is formed by etching the silicon substrate 1 from the surface thereof to a depth reaching the inside of the p-well 11. In other words, the height h of the semiconductor micro-needle 2 is larger than the depth of the p-n junction between the p-well 11 and its overlying portion of the silicon substrate 1. Consequently, the lower portion of the semiconductor micro-needle 2 closer to its base end is composed of p-type silicon, while the upper portion of the semiconductor micro-needle 2 is composed of n-type silicon, thereby forming a p-n junction 2a at a midpoint in the semiconductor micro-needle 2. Since another p-n junction is also formed between the p-well 11 and the main body of the silicon substrate 1, the quantized region Rqa is isolated from the n-type silicon substrate 1. The lateral electrode 10 is constituted so as to be connected to the p-well 11.

When a voltage of 50 Volt is applied in the forward direction between the transparent electrode 4 and the lateral electrode 10, the generation of visible electroluminescence at room temperature is also recognized in the present sixth embodiment. By varying the voltage for carrier injection from 25 to 200 Volt, the generation of visible electroluminescence corresponding to individual light emission in red, blue, and yellow is also recognized.

Thus, the above sixth embodiment provides the following effects in addition to the same effects as obtained in the above fifth embodiment. That is, since the quantized region Rqa composed of the aggregate of semiconductor micro-needles 2 is isolated from other regions by the lateral discrete insulating layer 9 as well as from the n-type silicon substrate 1 by the p-well 11, even in the case where a large number of quantized regions are formed on the silicon substrate, light emission can be generated individually in each of the quantized regions. Moreover, since the p-n junction is formed in each semiconductor micro-needle 2, carriers can be efficiently injected into each semiconductor micro-needle 2, thereby providing an optical semiconductor apparatus with excellent emission efficiency.

(Seventh Embodiment)

Next, a description will be given to a seventh embodiment. FIG. 16 is a cross sectional view of the optical semiconductor apparatus according to the seventh embodiment. The basic structure of the optical semiconductor apparatus of the present seventh embodiment is substantially the same as that of the above fifth embodiment shown in FIG. 14. Accordingly, the quantized region Rqa composed of the aggregate of semiconductor micro-needles 2 is formed on the p-type silicon substrate 1 and there are further formed the transparent electrode 4 over the quantized region Rqa, the discrete insulating layer 9 surrounding the quantized region Rqa, and the lateral electrode 10 connected to the silicon substrate 1 through the discrete insulating layer 9. In the present embodiment, however, the quantized region Rqa composed of the aggregate of semiconductor micro-needles 2 is not constituted by a single-layer structure, but by a structure in which linearly-striped quantized regions 12a, each containing both semiconductor micro-needles 2 and the insulating layer 3 for filling up the space surrounding each semiconductor micro-needle 2, and linearly-striped discrete layers 13a, each composed of a silicon dioxide film, are alternately arranged. FIG. 17(a) is a schematic plan view of the linearly striped structures, in which the linearly-striped quantized regions 12a (dotted portions in the drawing) and the linearly-striped discrete layers 13a (hollow portions in the drawing) are alternately arranged at such intervals as to constitute a one-dimensional Fresnel lens.

FIG. 17(b) is a plan view showing another example of the linearly striped structures, in which ring-shaped quantized regions 12b and ring-shaped discrete layers 13b are alternately arranged so as to constitute a two-dimensional Fresnel lens.

If a voltage is applied in the forward direction between the transparent electrode 4 and lateral electrode 10, the generation of visible electroluminescence at room temperature is also recognized in the present embodiment.

In the optical semiconductor apparatus thus constituted, since the regions 12a or 12b and the discrete layers 13a or 13b are alternately arranged, the whole quantized region Rqa functions as a Fresnel lens. Consequently, an additional light condensing apparatus is not necessary. That is, if light emission is generated in the quantized region Rqa constituting the one-dimensional Fresnel lens shown in FIG. 17(a) or the two-dimensional Fresnel lens shown in FIG. 17(b), light advancing in a direction perpendicular to the surface of the silicon substrate 1 is condensed onto a line or point, thereby condensing light into an intended region. Therefore, if an additional light receiving element is placed in the vicinity of the focus, the light emitted from the optical semiconductor apparatus is efficiently condensed into the light receiving element, so that it becomes possible to transmit electric power converted into signals or light to a distant location via the light receiving element. In the case of using the quantized region as a wavelength converting element or light receiving element, it becomes possible to irradiate the entire quantized region Rqa with light from a linear optical source or dotted optical source.

(Eighth Embodiment)

Figure 18:
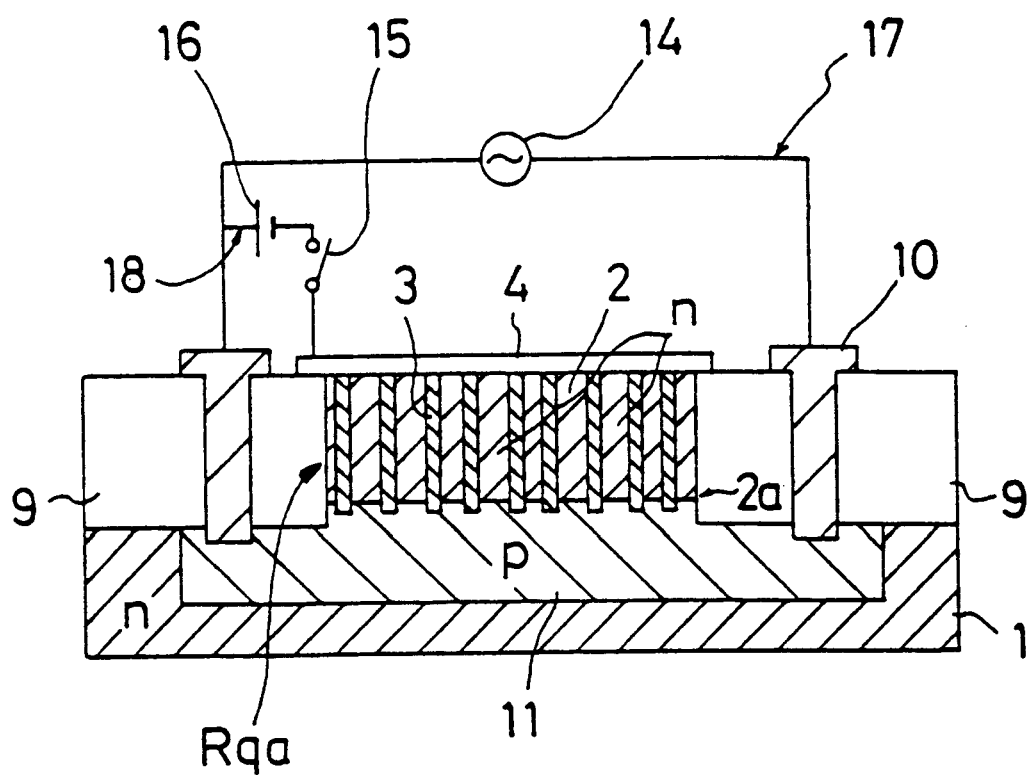
FIG. 18 is a cross sectional view of a semiconductor apparatus according to an eighth embodiment.

Next, a description will be given to an eight embodiment. FIG. 18 shows the cross sectional structure of the optical semiconductor apparatus according to the eighth embodiment, which is basically the same as the structure of the optical semiconductor apparatus according to the above seventh embodiment shown in FIG. 15. That is, there are disposed: the quantized region Rqa composed of the aggregate of silicon semiconductor micro-needles 2 each having the p-n junction 2a and of the insulating layer 3; the transparent electrode 4 over the quantized region Rqa: the p-well 11 holding the base end of each semiconductor micro-needles 2 in the quantized region Rqa and being electrically insulated from the n-type silicon substrate 1; the discrete insulating layer 9 surrounding the quantized region Rqa; and the lateral electrode 10 connected to the p-well 11 through the dielectric insulating layer 9. In the process of forming the above quantized region Rqa of the present embodiment, the p-well 11 is formed in the silicon substrate 1 and then the overlying region is turned into an n region, followed by the etching of the silicon substrate 1 till the p-well 11 is reached, using the first or second dotted mask as used in the above first embodiment. In accordance with the formation process, the p-n junction 2a is formed in each semiconductor micro-needle 2.

In the present eighth embodiment, two lateral electrodes 10 are disposed on both sides of the quantized region Rqa and a radio-frequency power source 14 for applying a radio-frequency voltage to a circuit 17 connecting these two lateral electrodes 10. To the circuit 18 connecting the circuit 17 and the transparent electrode 4 are connected in series a switch 15 for opening and closing the circuit 18 and a DC power source 16.

A description will be given to the operation of the silicon light emitting element thus constructed.

Figure 19:
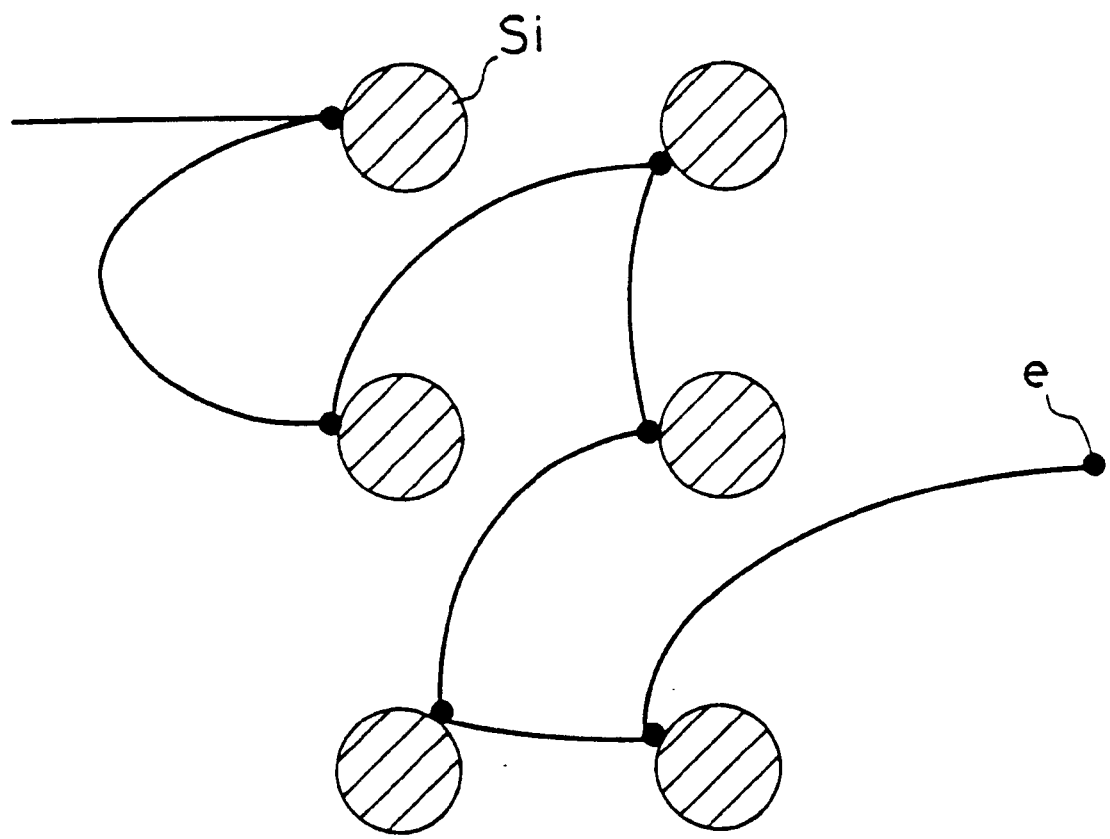
FIG. 19 is a view for illustrating the movement of electrons in a crystal lattice of silicon to which radio-frequency electric power has been applied.

As shown in FIG. 19, when a radio-frequency electric power is applied to the silicon crystal, electrons in a crystal lattice of silicon (indicated by solid circles) are excited by an electric field varying with high frequencies so as to move periodically to a certain extent. In the present embodiment, since the radio-frequency power source 14 is connected to the two lateral electrodes 10 formed in the dielectric insulating layer 9 in the vicinity of the semiconductor micro-needles 2, the electrons excited by the radio-frequency electric power are accumulated in the p-type silicon substrate 1. The accumulated electrons are introduced into each semiconductor micro-needle 2 in the quantized region Rqa by the voltage applied in the forward direction via the transparent electrode 4, so that a large amount of electrons are injected through the p-n junction 2a in each semiconductor micro-needle 2. The injection increases the light emission intensity in the quantized region Rqa. To the transparent electrode 4 is applied a voltage of 100 Volt. In this case also, visible electroluminescence is observed at room temperature.

As described above, in the present eighth embodiment, the electrons excited by the application of radio-frequency electric power to the p-type silicon substrate 1 are introduced into each semiconductor micro-needle 2 in the quantized region Rqa, so that a large amount of electrons are injected through the p-n junction 2a. As a result, intense light emission is caused efficiently in the quantized region Rqa even by a weak signal supplied to the transparent electrode 4.

Although the two lateral electrodes 10 are formed on both sides of the quantized region Rqa in the above eighth embodiment, three or more lateral electrodes 10 surrounding the quantized region Rqa may be formed so as to generate a rotating magnetic field in the quantized region Rqa by applying to the lateral electrodes radio-frequency electric power having the same frequency with its phase varying in increasing or decreasing order. In this case, higher emission efficiency can be obtained.

(Ninth Embodiment)

Next, a description will be given to a ninth embodiment. FIG. 20 partially shows the cross sectional structure of an optical semiconductor apparatus according to the ninth embodiment. In the present embodiment, the quantized region Rqa composed of the aggregate of semiconductor micro-needles 2 and a photodiode consisting of a p-type region 20a and an n-type region 20b are formed on the silicon substrate 1. Over the photodiode 20 and quantized region Rqa is provided the transparent electrode 4 to be used in common. In addition, a driving circuit 21 is provided for applying a specified voltage between the above transparent electrode 4 and the silicon substrate 1. That is, if an optical signal Sgo0 is input to the photodiode 20 with a constant bias being applied to the photodiode 20 via the driving circuit 21, an electromotive force is generated in the photodiode 20 so that an electromotive force generated in the photodiode 20 is converted by the driving circuit 21 to a voltage of, e.g., 15 V, which is then applied to each semiconductor micro-needle 2 in the quantized region Rqa. As a result, each semiconductor micro-needle 2 emits light which is output as a second optical signal Sgo2. In this case, the emission wavelength can be changed by changing the manufacturing specification of each semiconductor micro-needle 2.

Next, the process of manufacturing the optical semiconductor apparatus with a structure obtained by slightly modifying the structure shown in FIG. 20 will be described with reference to FIGS. 21(a) to 21(c). First, as shown in FIG. 21(a), the quantized region Rqa composed of the aggregate of semiconductor micro-needles 2 is formed in a given portion of the silicon substrate 1 made of silicon. Next, as shown in FIG. 21(b), an n region 24a is formed deep by injecting $As^+$ ions into the silicon substrate 1 by using the photo resist mask with an opening formed in a region different from the above quantized region Rqa, followed by the shallow formation of an n region 24b by injecting $B^+$ ions into the silicon substrate 1. In this step, the intermediate region in which either $As^+$ ions or $B^+$ ions are hardly injected becomes an intrinsic region 24c, thereby forming the photodiode 24 of so-called PIN structure which consists of the p region 24a, n region 24b, and intrinsic region 24c. The photodiode 24 may also be formed by preliminarily trenching deep that portion of the silicon substrate in which the photodiode 24 is to be formed and then epitaxially growing the regions 24a, 24c, and 24b in this order. Subsequently, as shown in FIG. 21(c), a conductive wire 25 which transmits light (made of, e.g., Au) is formed on the silicon substrate 1 and then the driving circuit 21 is further formed.

The optical semiconductor apparatus shown in FIG. 21(c) can be constituted so that the photodiode 24 receives the optical signal Sgo0 at a certain wavelength, while the second optical signal Sgo2 is output from each semiconductor micro-needle 2 in the quantized region Rqa. The wavelength of the second optical signal Sgo2 can be changed by changing the structure or manufacturing process. Since such an optical semiconductor apparatus can be manufactured by a process for a silicon device, it can be accommodated in a microchip, which makes it applicable to optical communication and the like.

It is also possible to produce a device with the function of modulating, with light, information being transmitted over a signal path by adding a circuit for converting the second optical signal Sgo2 to an electric signal to the structure of the optical semiconductor apparatus according to the above embodiment.

(Tenth Embodiment)

Figure 22A:
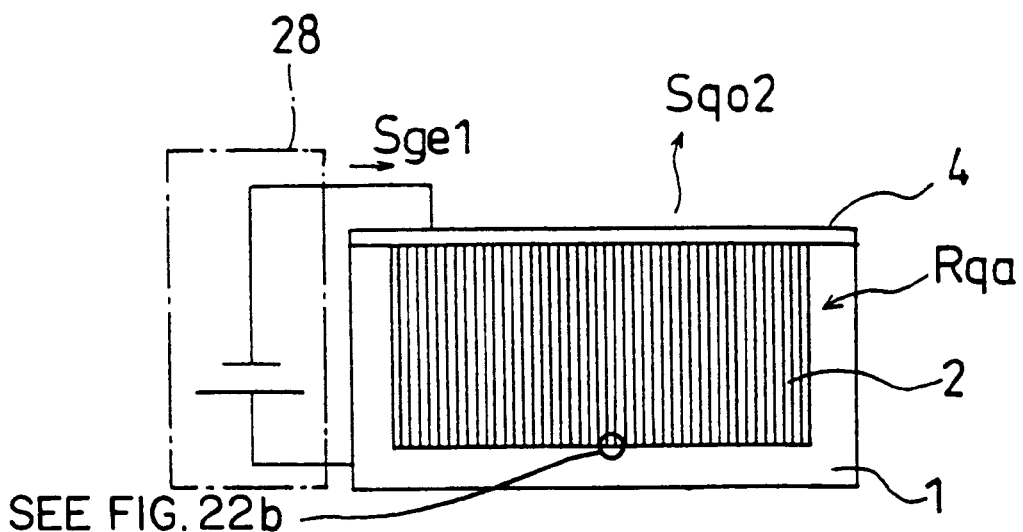
FIGS. 22(a) to 22(d) are a cross sectional views for illustrating the principle of a stress sensor utilizing the quantized region according to a tenth embodiment.

Next, a description will be given to a tenth embodiment, in which a stress sensor is constituted using an aggregate of semiconductor micro-needles. FIG. 22(a) shows the structure and principle of operation of the stress sensor in the tenth embodiment. That is, in the present embodiment, the quantized region Rqa composed of the aggregate of semiconductor micro-needles 2 and the transparent electrode 4 are formed on the silicon substrate 1, as shown in the drawing. In the optical semiconductor apparatus is also disposed the driving circuit 28 for applying a voltage to the quantized region Rqa via the transparent electrode 4.

Figure 22B:
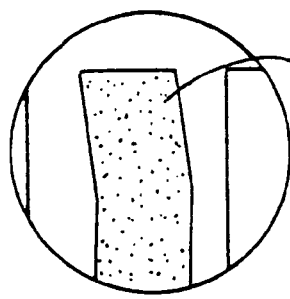
Figure 22C:
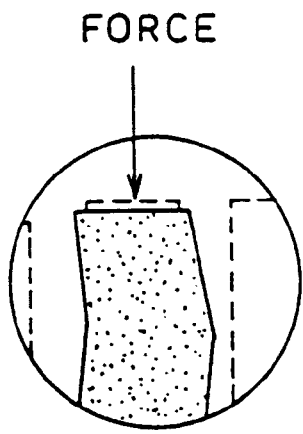
Figure 22D:
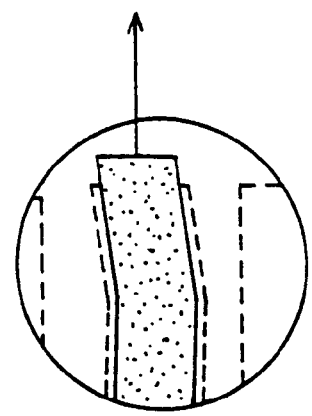

In FIGS. 22(a)–(d) are shown three variations in the configuration of each semiconductor micro-needle 2 in response to a change in the stress exerted thereon. FIG. 22(b) shows the semiconductor micro-needle 2 with no stress exerted thereon. FIG. 22(c) shows the semiconductor micro-needle 2 with a compressive force, towards the long wavelengths. FIG. 22(d) shows the semiconductor micro-needle 2 with a tensile stress exerted thereon, towards the short wavelenghts. As described above, when a voltage is applied to both ends of each semiconductor micro-needle 2, a bandgap widening occurs in the semiconductor micro-needle 2 due to the quantum size effect, so that electroluminescence in the visible region is observed. It is well known that the amount of the bandgap widening $\Delta E$ is inversely proportional to the diameter of each semiconductor micro-needle 2. Therefore, if the diameter d of each semiconductor micro-needle 2 on the order of 10 nm is changed by a force exerted from outside, the emission wavelength $\lambda$ which is inversely proportional to $1/\Delta E$ is also changed. For example, if a compressive stress is exerted on the semiconductor micro-needle 2, as shown in FIG. 22(c), the diameter d of the semiconductor micro-needle 2 increases in accordance with the Poisson's ratio, while the emission wavelength $\lambda$ shifts toward longer wavelengths. On the other hand, if a tensile stress is exerted on the semiconductor micro-needle 2, as shown in FIG. 22(d), the diameter d of the semiconductor micro-needle 2 decreases in accordance with the Poisson's ratio, while the emission wavelength shifts toward shorter wavelengths.

Figure 23A:
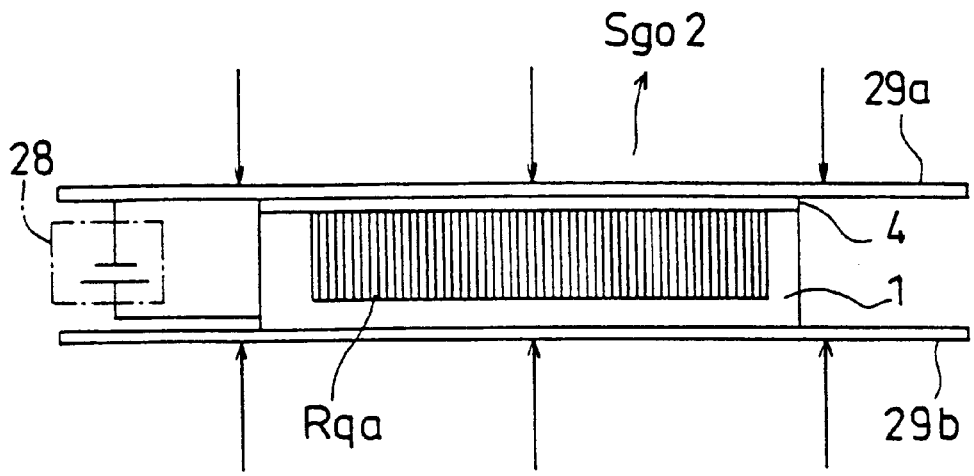
FIGS. 23(a) and 23(b) are views showing the cross sectional structure of the stress sensor of the tenth embodiment and variations in the wavelength of output light from the stress sensor with respect to variations in stress, respectively.
Figure 23B:
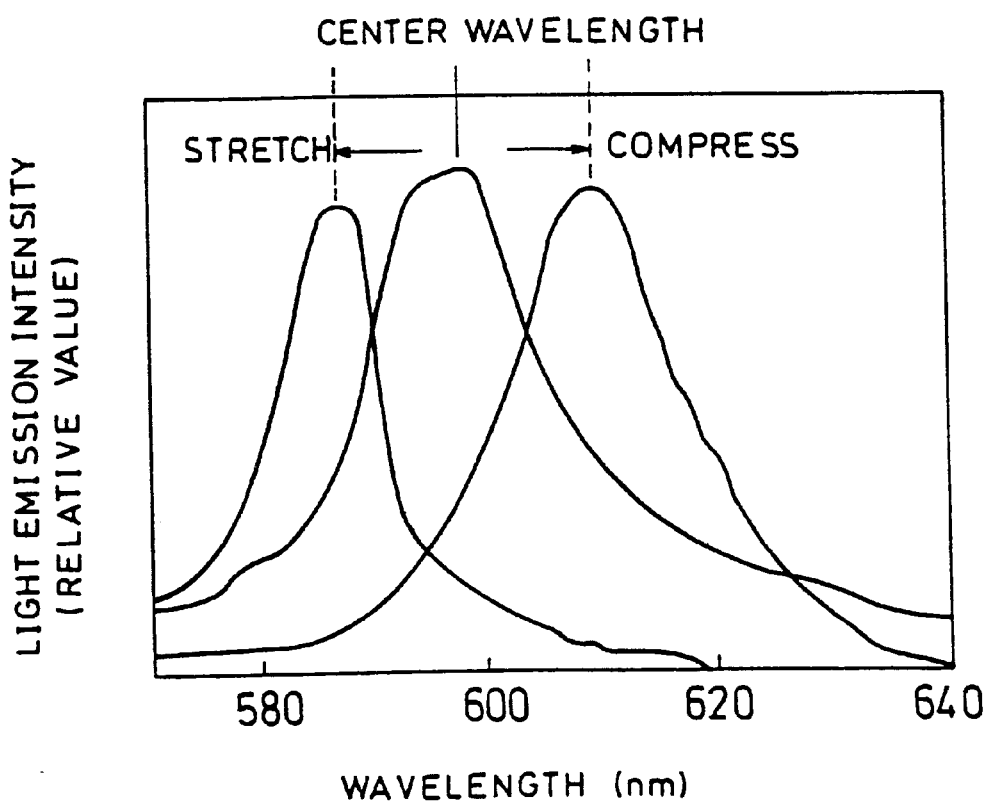

FIG. 23(a)) shows an example of the structure of a stress sensor using an aggregate of semiconductor micro-needles. In addition to the basic structure shown in FIG. 22(a), transparent probes 29a and 29b for transmitting an external force to each semiconductor micro-needle 2 in the quantized region Rqa are provided on the top and bottom faces of the silicon substrate 1. FIG. 23(b) shows the emission spectra of the second optical signal Sgo2 output from the quantized region Rqa, in which the center emission wavelength of 630 nm has shifted about 10 nm toward shorter wavelengths and toward longer wavelengths in response to compression and stretching under 1 Pa, respectively. In particular, by connecting the probes 29a and 29b for detecting a stress to an object from which an external force is to be detected so as to use the probes 29a and 29b and the transparent electrode 4 as stress transmitting means, a stress can be converted into an optical signal with high sensitivity. In the present embodiment also, the optical semiconductor apparatus can be manufactured easily by means of the process for a silicon device.

As will be described in the following embodiment, it is also possible in the present embodiment to detect the second optical signal Sgo2 from the quantized region Rqa by means of a light receiving element and to convert it into an electric signal.

(Eleventh Embodiment)

Figure 24:
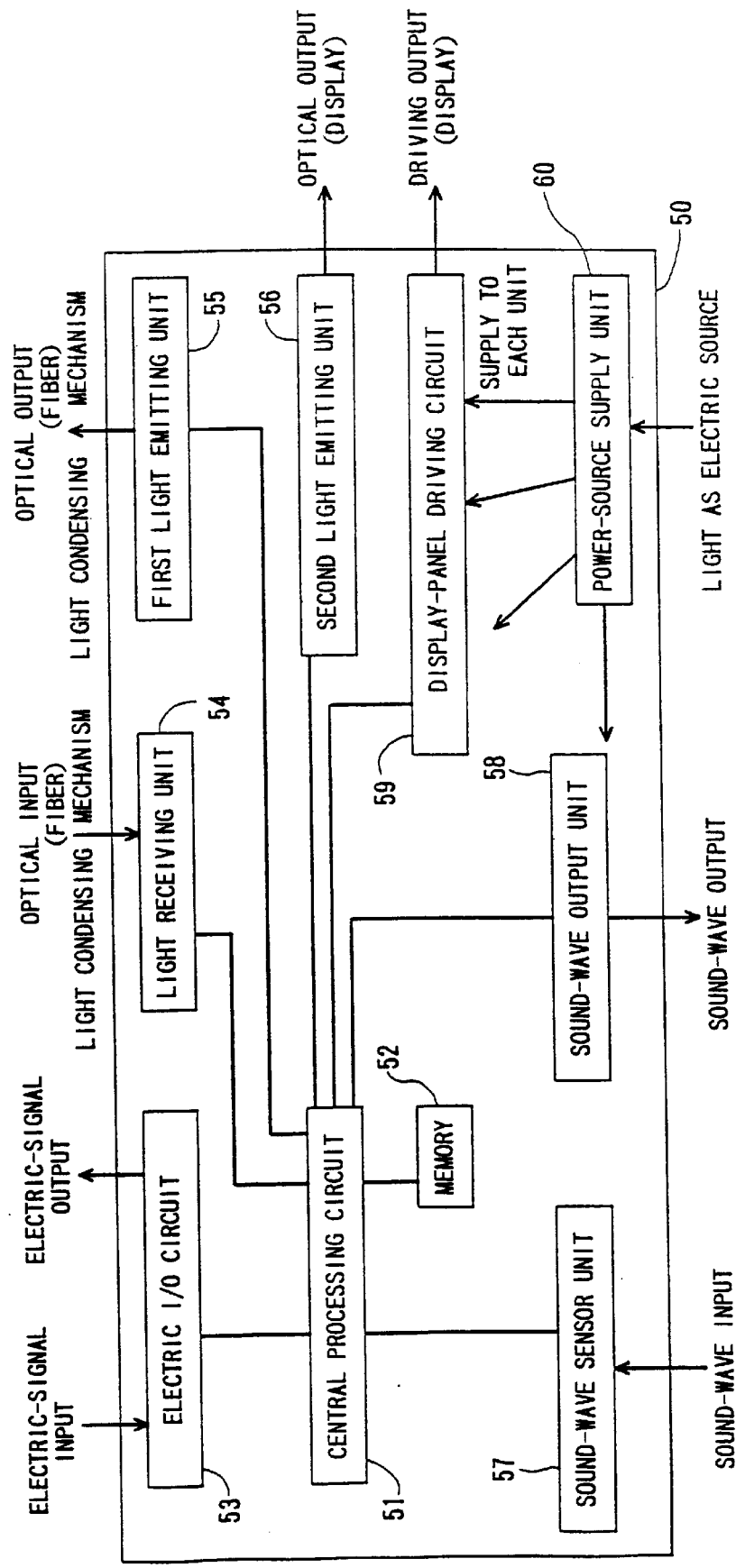
FIG. 24 is a block diagram showing the overall structure of the semiconductor apparatus according to the tenth embodiment.

Next, a description will be given to an eleventh embodiment. FIG. 24 shows the overall structure of the semiconductor apparatus according to the eleventh embodiment, which can be used as a pocket computer with high performance. There are provided on a semiconductor chip 50: a central processing circuit 51 for processing signals associated with each circuit on the semiconductor chip 50; a memory 52; an electric I/O circuit 53; a light receiving unit 54 for receiving an optical signal via a condensing mechanism; a first light-emitting unit for outputting an optical signal; a second light-emitting unit 56 for displaying a signal via pixels on the semiconductor chip 50; a sound-wave sensor unit 57 and sound-wave output unit 58 for inputting and outputting a sound wave; a display-panel driving circuit 59 for driving a display panel composed of a TFT liquid-crystal panel; and a power-source supply unit 60 for converting an optical signal from the outside into an electric signal so that each circuit on the semiconductor chip 50 is supplied with the resulting electric signal as the power source. The above memory 52, electric I/O circuit 53, light receiving unit 54, light emitting units 55 and 56, sound-wave sensor unit 57, sound-wave output unit 58, and display-panel driving circuit 59 are connected to the central processing circuit 51 via signal lines.

In this structure, of the units described above, such units as the central processing circuit 51, memory 52, electric I/O circuit 3 have a MOS transistor structure similar to that used in the conventional silicon integrated circuit. The light receiving unit 54 has a common phototransistor structure.

On the other hand, each of the first light emitting unit 55 and second light emitting unit 56 is constituted by the quantized region composed of an aggregate of semiconductor micro-needles similar to that used in the above first embodiment and the like.

FIGS. 25(a-1) to 25(d-2) show the process of forming an aggregate of semiconductor micro-needles in the present embodiment. In each of the drawings, FIGS. 25(a-1), 25(b-1), 25(c-1) and 25(d-1) are showing the cross sectional views, while FIGS. 25(a-2), 25(b-2), 25(c-2) and 25(d-2) are showing the plan views. First, as shown in FIGS. 25(a-1) and 25(a-2), a photoresist film Frs is formed on the silicon substrate 1. Next, as shown in FIGS. 25(b-1) and 25(b-2), F2 vacuum ultraviolet laser light, which has been divided into two beams, are obliquely made incident so that the two beams overlap each other. Subsequently, the interference fringe is exposed to be developed. After the first exposure, those portions of the photoresist film Frs corresponding to the intensely exposed portions of the interference fringe are removed, resulting in a striped mask pattern, as shown in the right-hand view of FIG. 25(b-1). The silicon substrate 1 in the position shown in FIG. 25(b-2) is then rotated 90 degrees, though the drawing thereof is omitted here, so that the same two beams of laser light are made incident thereon, thereby eventually providing the first dotted mask Ms1 which is several nm square. Since the interference fringe of the laser light is formed with a specified pitch determined by the wavelength and incident angle, the size of the dotted mask Ms1 can be regulated as desired. Next, as shown in FIGS. 25(c-1) and 25(c-2), the silicon substrate 1 is etched to a depth of 0.5 to several $\mu$m using the first dotted mask Ms1, thereby forming the aggregate of semiconductor micro-needles 2. The etching conditions are the same as those used in the first embodiment. Then, after removing the photoresist film Frs, the space surrounding each semiconductor micro-needle 2 is filled with the insulating layer 3 by subjecting the side portions of each semiconductor microneedle 2 to thermal oxidation, followed by surface flattening. Subsequently, as shown in FIGS. 25(d-1) and 25(d-2), the flattened oxide layer on the top ends of the semiconductor micro-needles 2 is removed, followed by the formation of the transparent electrode 4 over the quantized region Rqa.

The formation of the dotted mask Ms1 by patterning the photoresist film Frs is not limited to the formation of the interference fringe as in the present embodiment. It is also possible to form a large number of longitudinal and transverse trenches in a pre-baked photoresist mask by horizontally moving the silicon substrate with a probe needle of the cantilever of an atomic force microscope being pressed onto the silicon substrate under a specified pressure, so that the remaining dotted portions constitute the dotted mask. It is also possible, in forming the dotted mask by patterning the photoresist film, to form the oxide film on the silicon substrate 1, as in the above first embodiment, and then pattern the oxide film into dots by using the first dotted mask composed of the photoresist film, so that they serve as the second dotted mask in etching the semiconductor.

Figure 26:
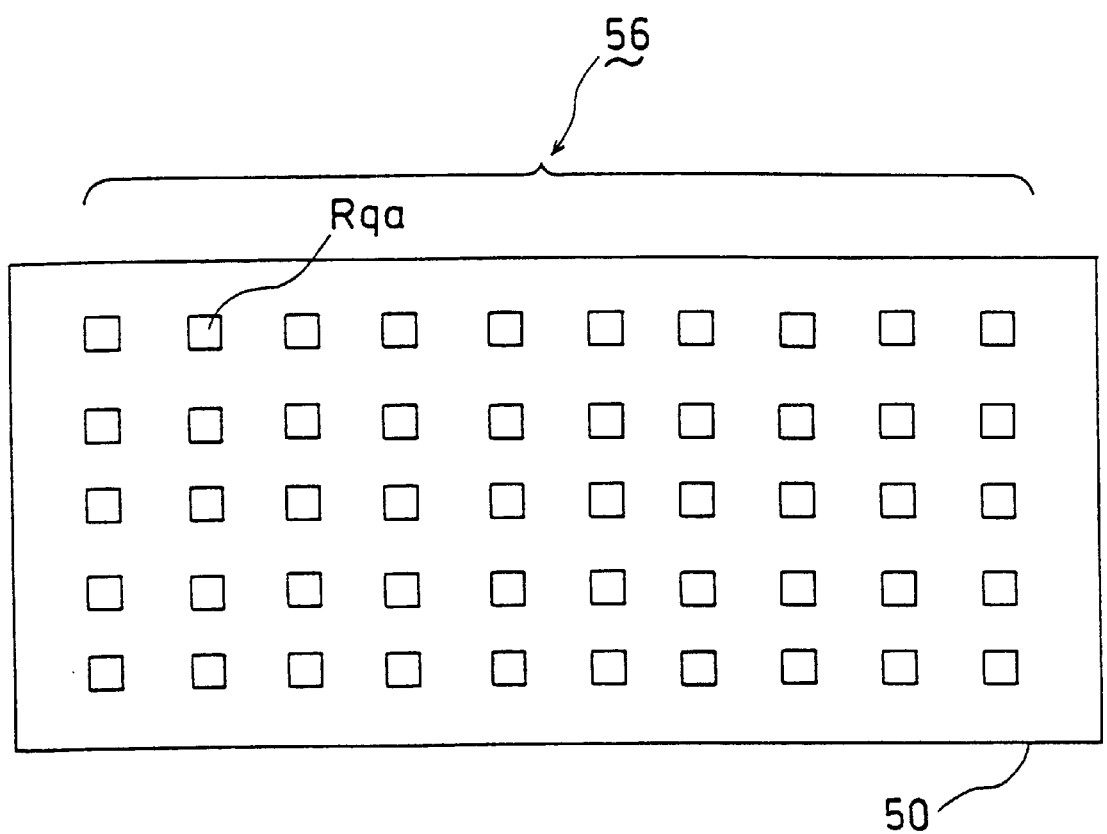
FIG. 26 is a plan view of a display apparatus according to the eleventh embodiment.

FIG. 26 is a plan view of the semiconductor chip 50 according to the present embodiment, in which the second light emitting unit 56 composed of a large number of quantized regions Rqa (aggregates of semiconductor microneedles) arranged in matrix are disposed on the semiconductor chip 50. That is, each of the quantized regions Rqa in the second light emitting unit 56 is turned on or off in response to a signal so that a specified pattern is displayed, thereby displaying, e.g., the results of the defective/nondefective judgments on the circuits on the semiconductor chip 50.

Figure 27:
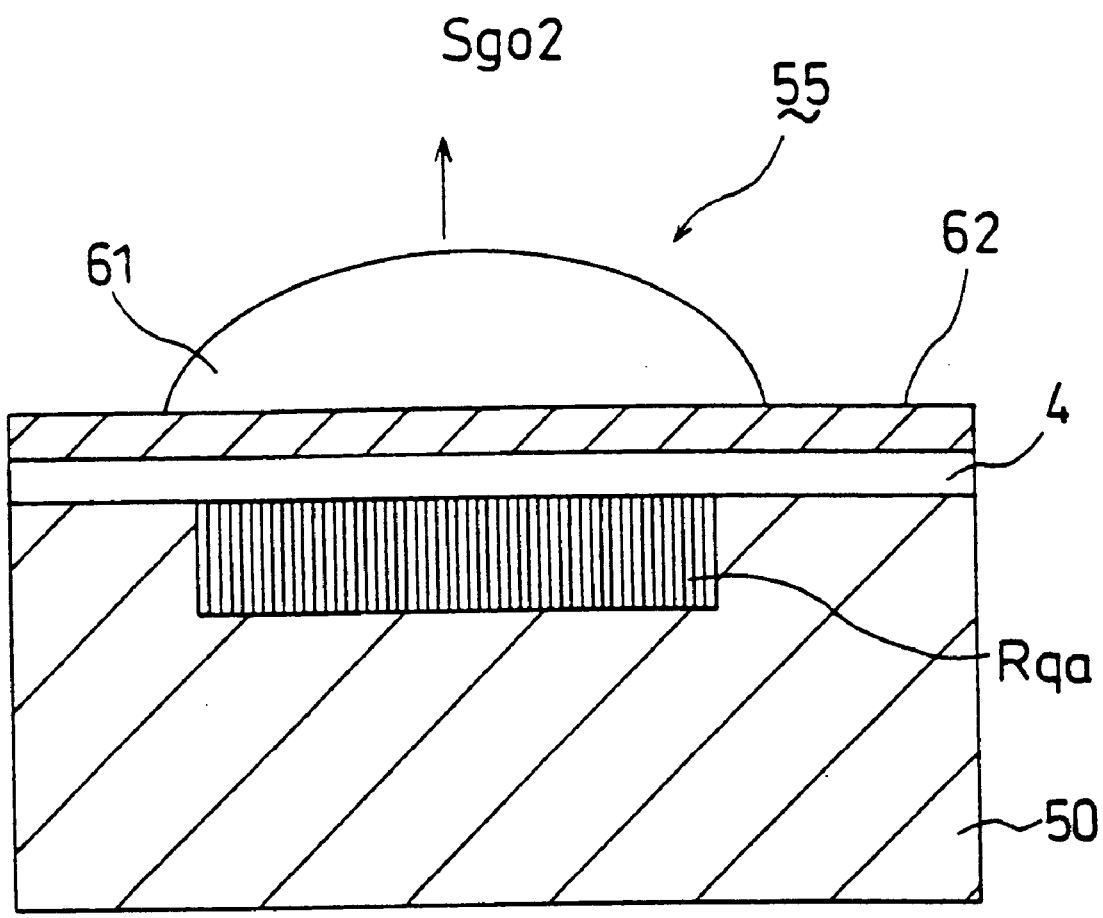
FIG. 27 is a cross sectional view partially showing a first light emitting unit of the semiconductor apparatus according to the eleventh embodiment.

On the other hand, the optical signal output from the first light emitting unit 55 is transmitted to the outside via an optical fiber. FIG. 27 shows the cross sectional structure of the first light emitting unit 55, in which the transparent electrode 4 is formed over the quantized region Rqa composed of an aggregate of semiconductor micro-needles and a convex lens 61 serving as a light condensing mechanism is disposed on the transparent electrode 4 with a filter interposed therebetween. The second optical signal Sgo2 condensed by the convex lens 61 is output to the outside via the optical fiber (not shown). The filter 62 is a band-pass filter produced by stacking a plurality of transparent thin films, each having a different refractive index, so as to cause multiple interference. Although the provision of the filter 62 is not mandatory, if it is required to transmit the signal over a comparatively long distance, the filter can suppress the attenuation of a signal by reducing the width of the optical band, so that the filter is preferably provided over the quantized region Rqa of the first light emitting unit 55. With the provision of the additional condensing mechanism such as a convex lens, the connection with the optical fiber, which has been provided substantially perpendicular to the surface of the semiconductor chip 50, is improved.

The display-panel driving circuit 59 is composed of a normal MOS integrated circuit, which is for using a liquid-crystal display apparatus (LCD) if a displaying function covering a large area is required.

Figure 28A:
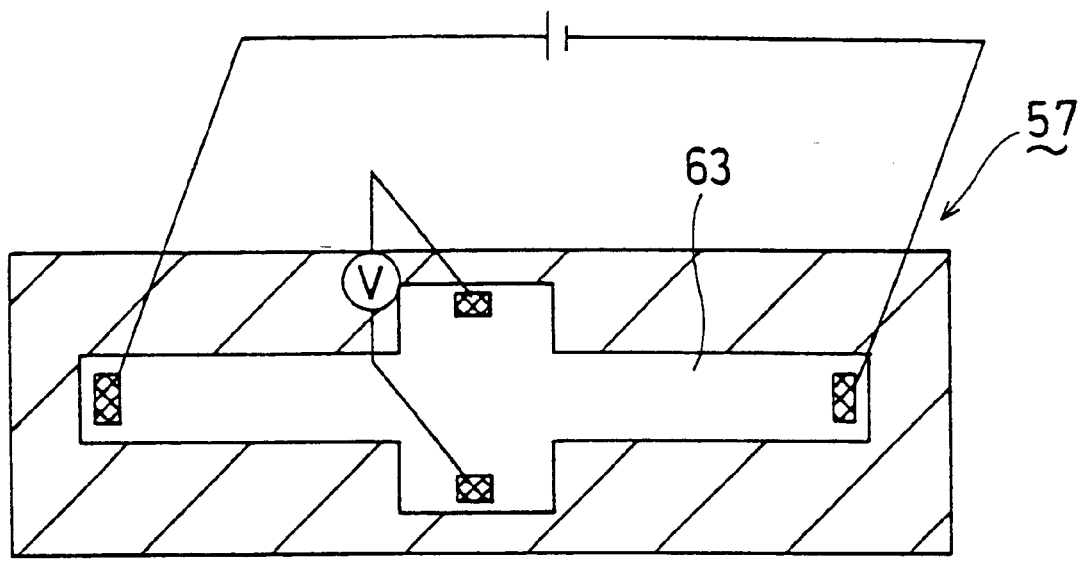
FIGS. 28(a) and 28(b) are cross sectional views and plan views showing the structure of a sound-wave sensor unit in the semiconductor apparatus according to the eleventh embodiment.
Figure 28B:
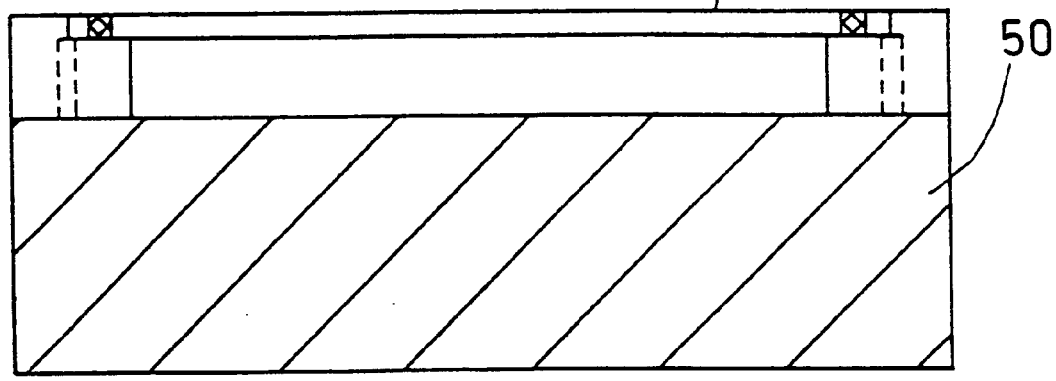

In the sound-wave sensor unit 57, a thin diaphragm 63 supported at four points is formed on the semiconductor chip 50, as shown in FIGS. 28(a) and 28(b), so that a sound wave is converted into an electric signal based on a phenomenon that the amount of displacement of the diaphragm 63 caused by the sound wave is proportional to a variation in the resistance of a bridge (a piezoresistance effect). A piezoresistance effect element has been developed as a stress sensor, the technique of which is applied to the present embodiment. It is also possible to detect a variation in capacitance between the electrode and the substrate, as if with a condenser microphone.

Figure 29:
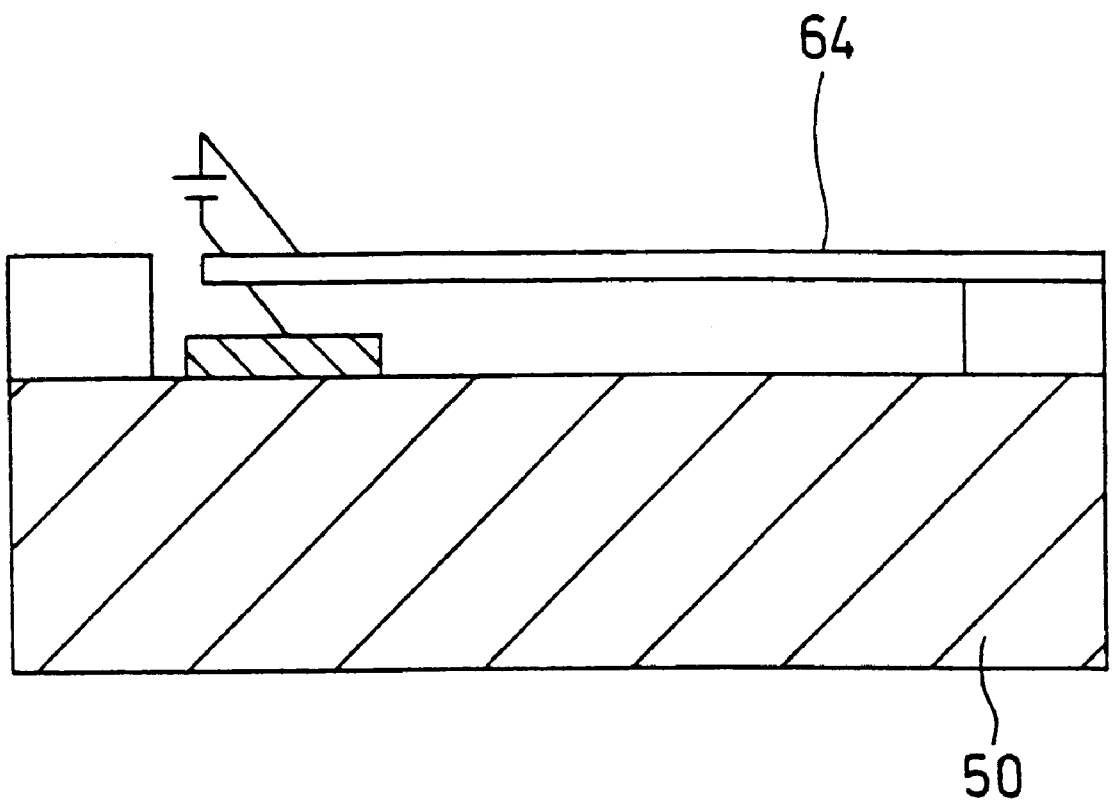
FIG. 29 is a cross sectional view showing the structure of the sound-wave output unit in the semiconductor apparatus according to the eleventh embodiment.

The above sound-wave output unit 58, comprising a cantilever diaphragm 64 as shown in FIG. 29, is constituted so that the diaphragm 64 is vibrated by an electrostatic force caused by a sound signal, thereby generating a sound wave. It is also possible to drive an external low-power speaker with a sound signal, instead of a unit having such a structure.

The above power-source supply unit 60 is a circuit for converting light from the outside into electric energy, so that the resulting electric energy is supplied to each circuit on the semiconductor chip 50. The power-source supply unit 60 consists of: a photodiode for receiving light and converting it into a current signal; and a constant voltage circuit for receiving the current signal and generating a constant voltage of the order of 3 to 5 V (the drawing thereof is omitted). When the power source is supplied using not light but an electromagnetic wave such as a millimeter wave or a microwave, a detection circuit and constant voltage circuit, composed of an antenna and a diode, can be used instead.

As has been described in the present embodiment, a wireless operation of the semiconductor apparatus can be accomplished by inputting a signal with the use of light or supplying electric power with the use of light. Moreover, the delay of a signal resulting from a parasitic impedance can be minimized by not providing wires for receiving signals and electric power. Since multiple functions can be implemented by one chip, the semiconductor apparatus according to the present embodiment can contribute greatly to the miniaturization of a portable computer and the like. Since the semiconductor apparatus according to the present embodiment is provided with the function of inputting and outputting a signal using a sound wave, it can contribute to the advancement of a human interface of computers. Also in the process of manufacturing the semiconductor apparatus, a part of the wiring step is not required any more, resulting in a reduction in manufacturing cost and a higher production yield. Furthermore, if an emission displaying function and a self-checking function are used in combination, only defective products can easily be screened by the displaying function, so that checking cost and time can be reduced.

(Twelfth Embodiment)

Figure 30A:
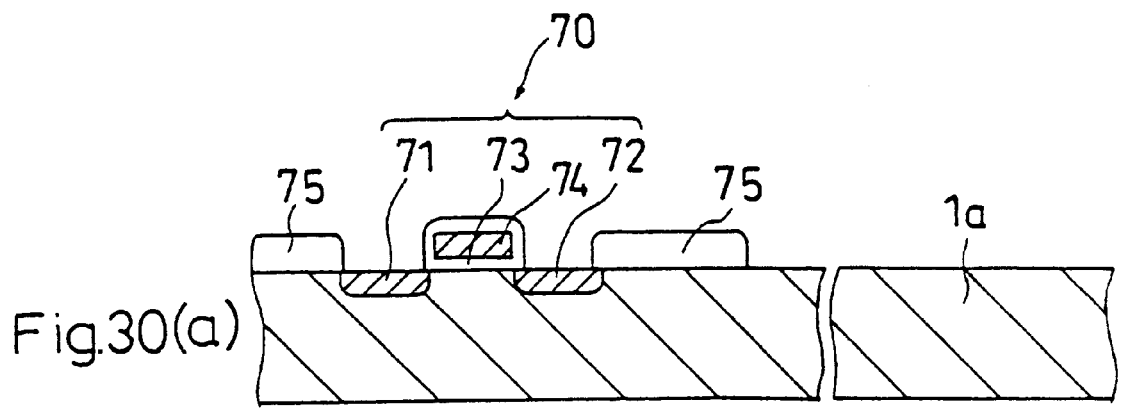
FIGS. 30(a) to 30(d) are cross sectional views showing the transition of the structure of the semiconductor apparatus according to a twelfth embodiment during its manufacturing process.
Figure 30B:
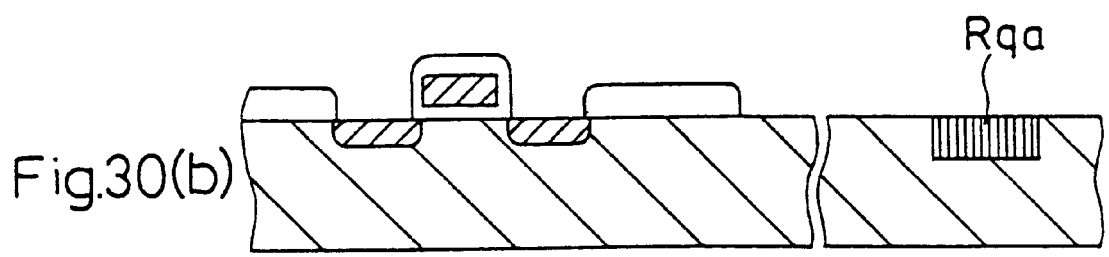
Figure 30C:
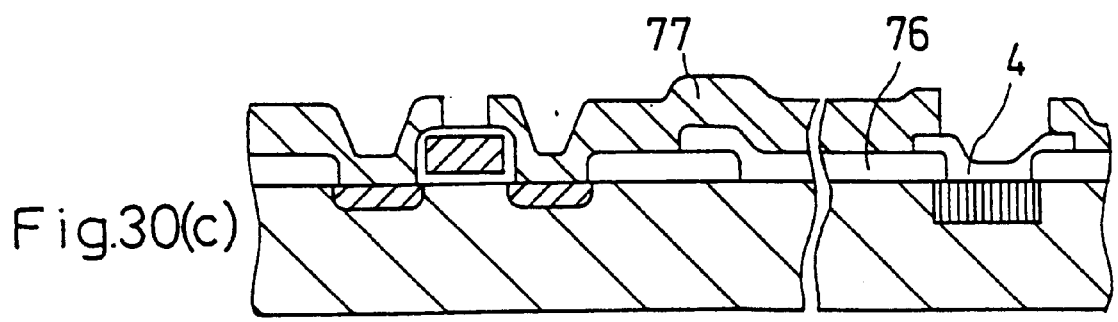
Figure 30D:
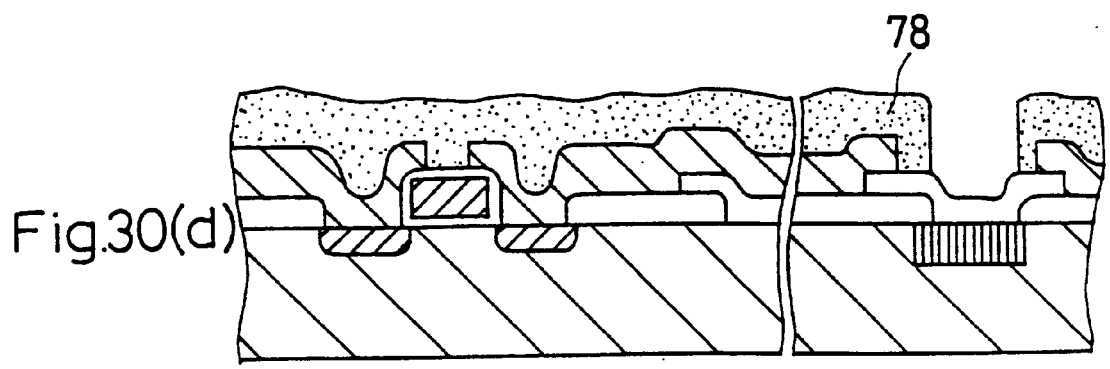

Next, a description will be given to a twelfth embodiment. FIGS. 30(a) to 30(d) show the process of manufacturing the optical semiconductor apparatus in which a light receiving element and a light emitting element are incorporated into an integrated circuit. First, as shown in FIG. 30(a), there is formed on a p-type silicon substrate 1 a MOSFET 70 consisting of: an n-type source 71; an n-type drain 72; a gate oxide film 73; a gate electrode 74; and an inter-layer insulating film 75. Next, as shown in FIG. 30(b), the quantized region Rqa composed of an aggregate of semiconductor micro-needles and functioning as a light emitting element is formed in that region with an opening of the inter-layer insulating film 75 which is adjacent to the region in which the above MOSFET 70 is to be formed, in accordance with the process used in the above first embodiment. Then, as shown in FIG. 30(c), an insulating film 76 is formed with an opening corresponding to each quantized region, followed by the formation of the transparent electrode 4 composed of an ITO so as to cover the quantized region Rqa and a part of the above insulating film 76. Thereafter, a metal wire 77 for electrically connecting the drain 72 to the transparent electrode 4 is formed. Then, as shown in FIG. 30(d), over the wire 77 made of metal, polysilicon, and the like and over the transparent electrode 4, an inter-substrate insulating film 78 is formed with an opening corresponding to the quantized region Rqa, followed by surface flattening.

On the other hand, there is formed on another silicon substrate 1b, a photodiode 79 consisting of a p region and an n region and functioning as a light receiving element is formed instead of the quantized region Rqa formed in the steps shown in FIGS. 30(a) to 30(d), though the drawing thereof is omitted. On the photodiode 79 is disposed the transparent electrode 4, and the inter-substrate insulating film 78 with an opening corresponding to the photodiode is further formed.

Figure 31:
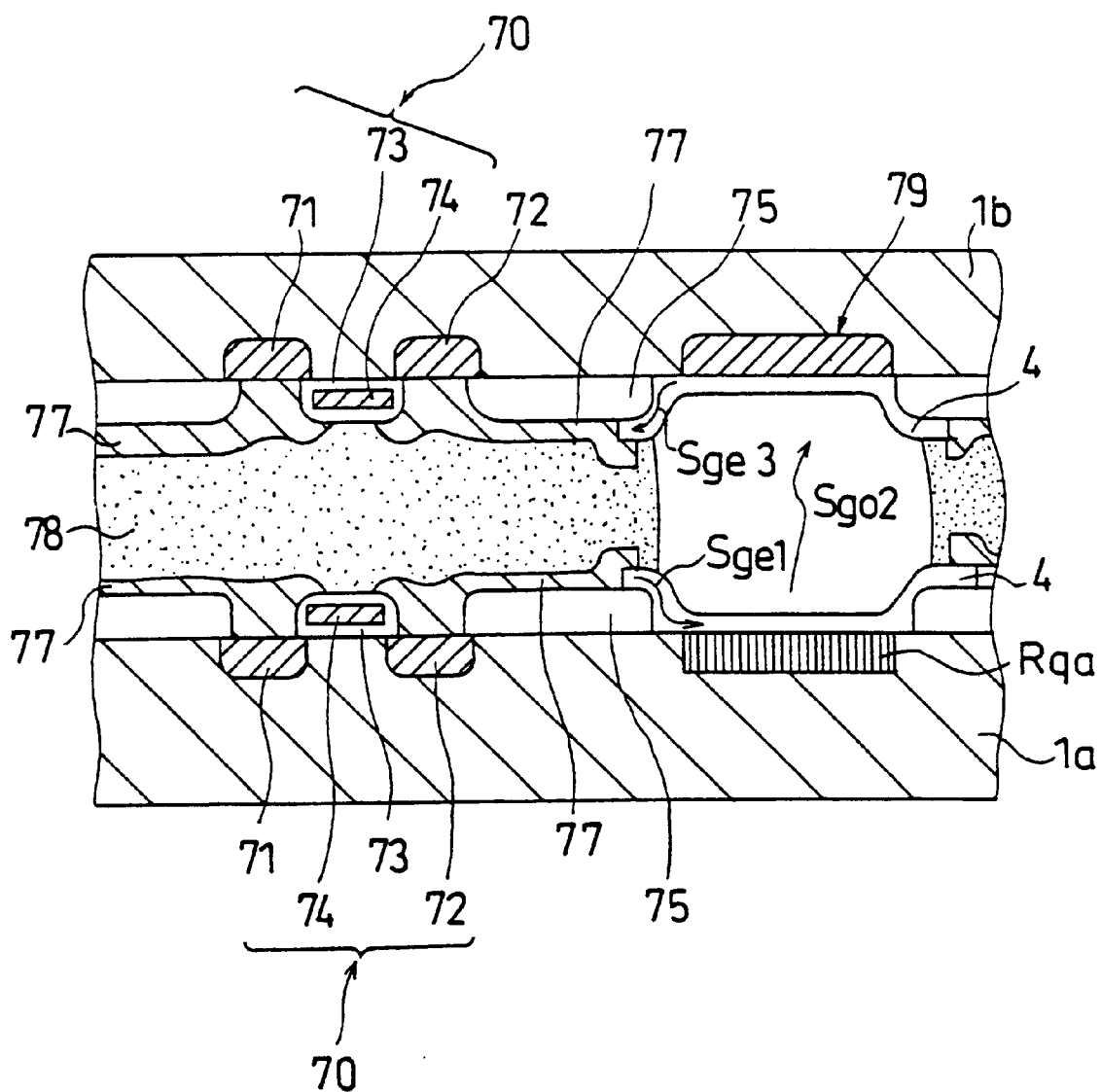
FIG. 31 is a cross sectional view of the semiconductor apparatus according to the twelfth embodiment.

FIG. 31 shows the cross sectional structure of the optical semiconductor apparatus in which the above two silicon substrates 1a and 1b are joined with the inter-substrate insulating film 78 interposed therebetween, so that the quantized region Rqa and the photodiode 79 are opposed to each other. The drain 72 of the MOSFET 70 serving as the output electrode of the lower logic circuit is connected to the quantized region Rqa composed of an aggregate of semiconductor micro-needles, each having a thickness of 0.1 μm, via the transparent electrode 4. If the electric potential of the drain 72 as the output electrode is raised to 2 V, the first electric signal Sge1 is output so that an electric field of about 0.2 MV/cm is applied to each semiconductor micro-needle in the quantized region Rqa. Upon receiving the first electric signal Sge1, each semiconductor micro-needle emits light, so that the second optical signal Sgo2 is output from the quantized region Rqa. When the second optical signal Sgo2 transmitted by the transparent electrode 4 is input to the photodiode 79, the third electric signal Sge3 is output from the photodiode 79. The third electric signal Sge3 is input to the drain of the lateral MOSFET 70 via the metal wire 77. The subsequent signal processing is performed in the same manner as in a normal integrated circuit.

Thus, the present embodiment provides an optical semiconductor apparatus into which a composite device having an optical processing function is incorporated, wherein an output signal is converted from an electric signal to an optical signal by a light receiving element formed in an integrated circuit and then converted again to an electric signal.

(Thirteenth Embodiment)

Figure 32A:
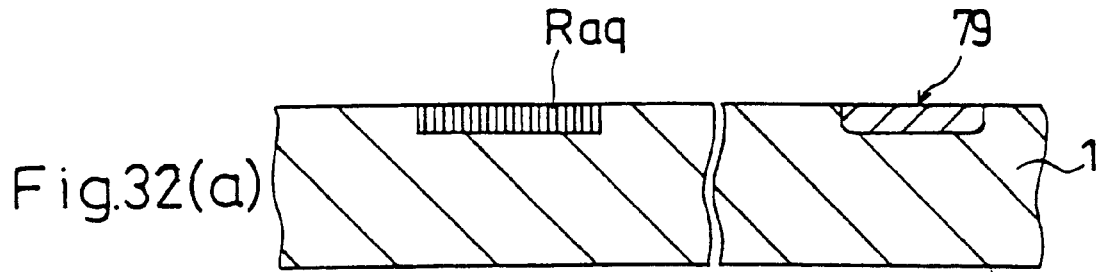
FIGS. 32(a) to 32(d) are cross sectional views showing the transition of the structure of the semiconductor apparatus according to a thirteenth embodiment during its manufacturing process.
Figure 32B:
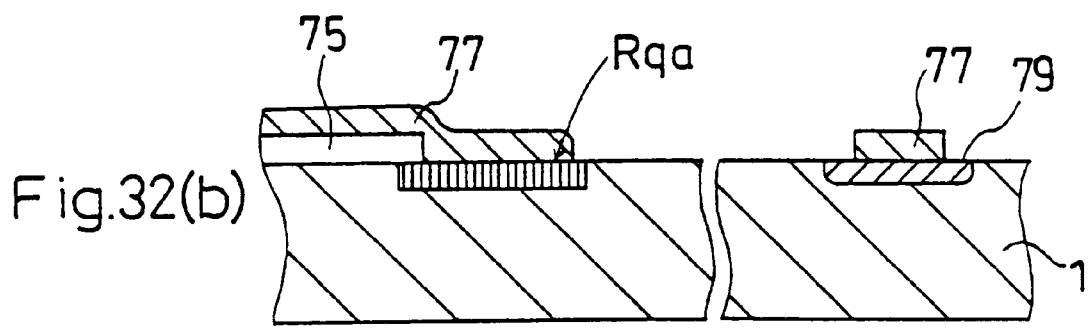
Figure 32C:
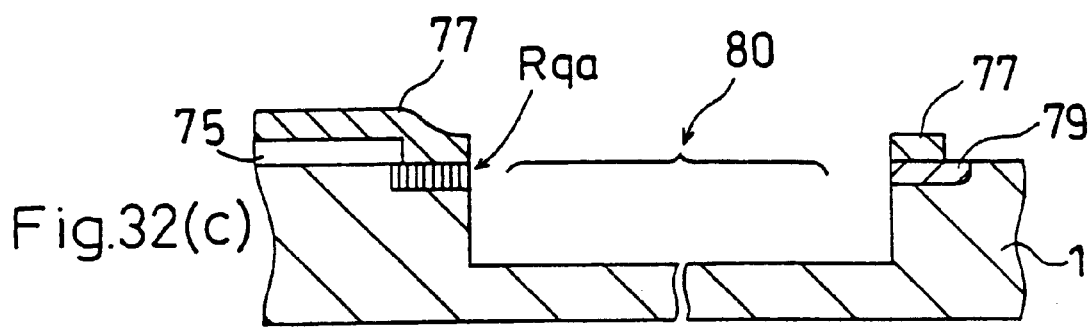

Next, a description will be given to a thirteenth embodiment. FIGS. 32(a) to 32(d) illustrate the process of manufacturing the optical semiconductor apparatus, which is constituted so that a light emitting element and a light receiving element are opposed to each other with a trench interposed therebetween. First, as shown in FIG. 32(a), the quantized region Rqa, composed of an aggregate of semiconductor micro-needles and functioning as a light emitting element, and the photodiode 79, consisting of a p region and an n region and functioning as a light receiving element, are formed in two adjoining regions of the silicon substrate 1. Next, as shown in FIG. 32(b), the inter-layer insulating film 75 and the wire 77 made of polysilicon are formed over the quantized region Rqa and photodiode 79. In this case, it is not required to form a transparent electrode over the quantized region Rqa and photodiode 79. Next, as shown in FIG. 32(c), that region of the silicon substrate 1 which is interposed between the quantized region Rqa and the photodiode 79 and which includes a part of the quantized region Rqa and a part of the photodiode 79 is etched so as to form a trench 80.

Figure 32D:
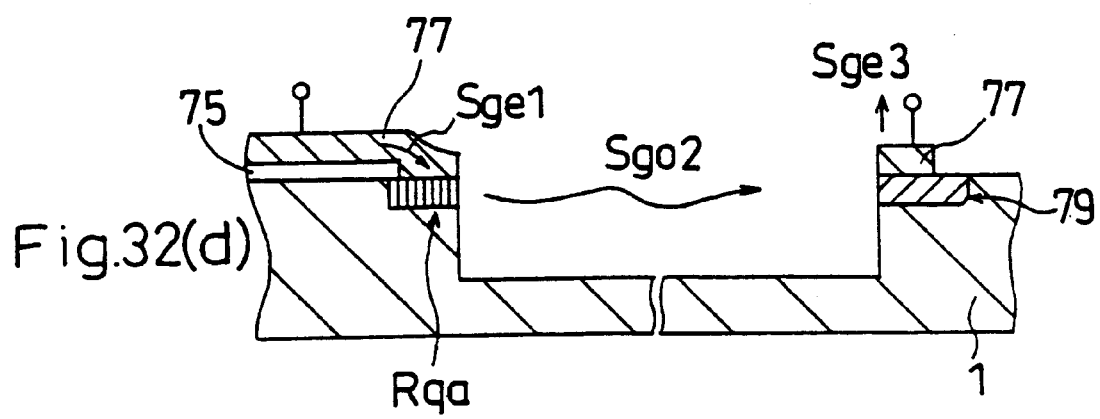
Figure 33:
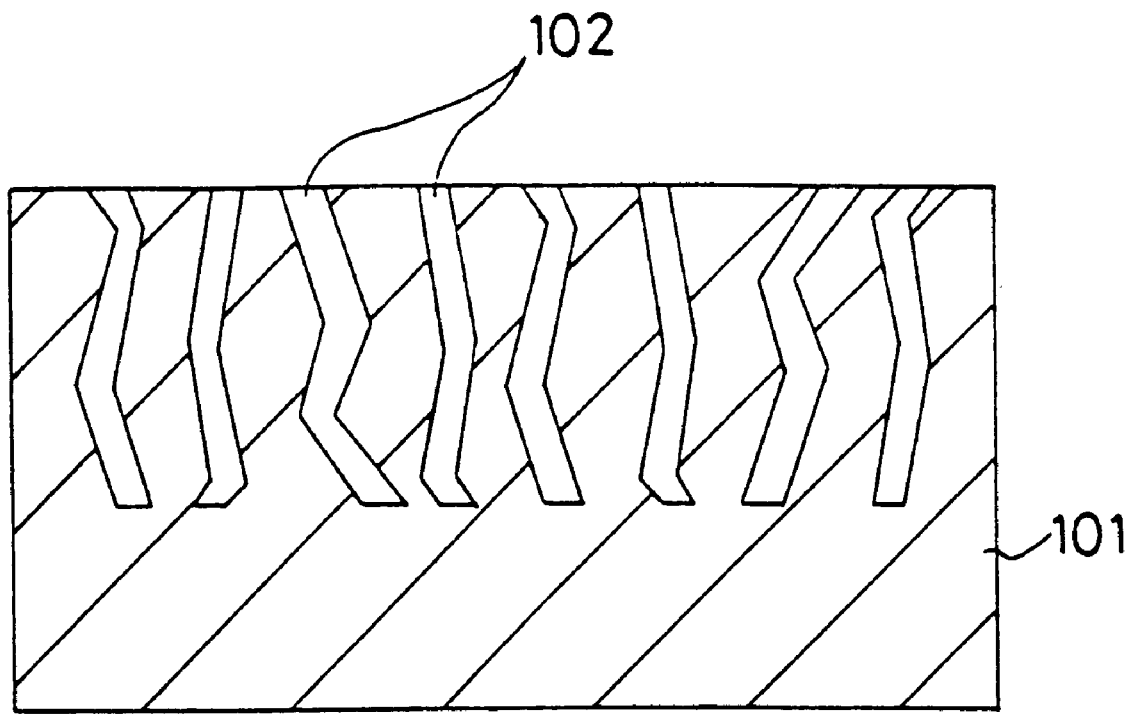
FIG. 33 is a cross sectional view of the conventional porous silicon formed by anodization.
Figure 34:
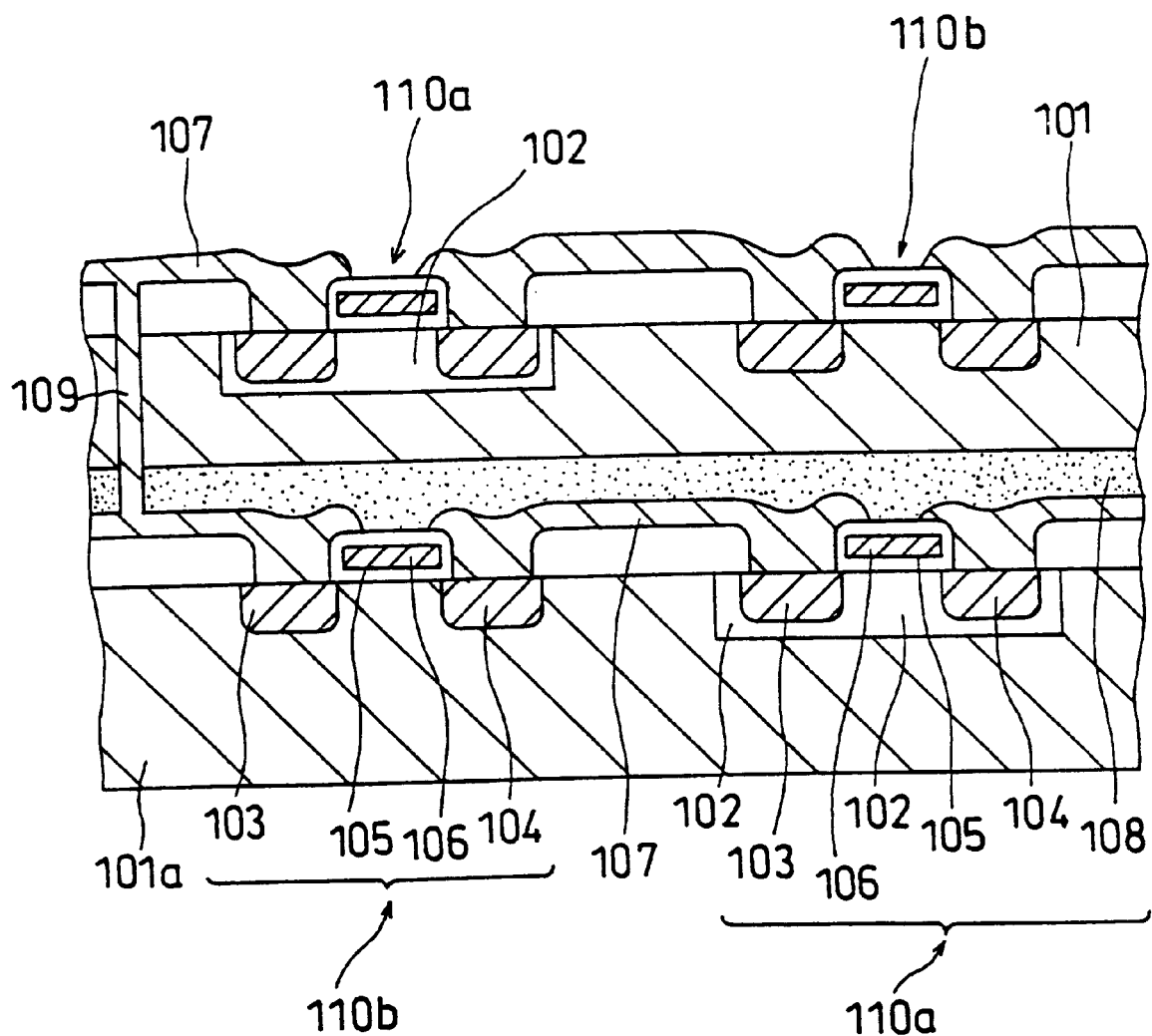
FIG. 34 is a cross sectional view partially showing a conventional three-dimensional integrated circuit system.

FIG. 32(d) shows the cross sectional structure of the optical semiconductor apparatus that has been finished. As shown in the drawing, one side portion of the quantized region Rqa serving as a light emitting element and one side portion of the photodiode 79 serving as a light receiving element are exposed. In other words, the quantized region Rqa and the photodiode 79 are formed in the side walls of the trench 80 so as to face each other. As shown in FIG. 1 of the first embodiment, since the insulating layer 3 composed of a transparent silicon dioxide film is formed so as to surround each semiconductor micro-needle 2 in the quantized region Rqa, light emission from the quantized region Rqa is also observable from its lateral side. Consequently, in the present embodiment, if the first electric signal Sge1 is input to the quantized region Rqa via the wire 77, the second optical signal Sgo2 is output from the quantized region Rqa, which is further converted into the third electric signal Sge3 by the photodiode 79. In the present embodiment, the joining of the two substrates is not particularly required and the same function as performed by the three-dimensional integrated circuit structure of the twelfth embodiment can be performed by a two-dimensional integrated circuit. Moreover, since the present embodiment is free from problems associated with alignment, a composite device having an optical processing function can easily be disposed in the manufacturing process.

Although each of the above embodiments has used a single-crystal silicon substrate, the present invention is not limited to these embodiments. The present invention is also applicable to, e.g., single-element semiconductors such as germanium and to group II–V compound semiconductors such as GaAs, GaP, GaN, and InP. In particular, if the semiconductor micro-needles are formed from a material having a band structure of direct-transition type such as Ga—As, light emission intensity is advantageously increased due to the quantum size effects as well as laser light with excellent characteristics can easily be obtained. Moreover, the semiconductor micro-needles should not necessarily be formed from a single-crystal material. It is also possible to constitute a highly efficient solar battery or the like based on a highly efficient photoelectric conversion, which can be performed by using, e.g., an aggregate of amorphous silicon micro-needles.

Although each of the above embodiments has formed the aggregate of the semiconductor micro-needles 2 directly on the silicon substrate 1, the present invention is not limited to these embodiments. It is also possible to form an aggregate of semiconductor micro-needles on the silicon substrate with an insulating film interposed therebetween. In other words, a so-called SOI structure can be formed.

We claim:

1. A method of manufacturing an aggregate of semiconductor micro-needles, comprising the steps of:

forming a dotted mask comprising tin or rhodium crystal growth nuclei on a silicon substrate; and etching said silicon substrate using said dotted mask so as to form a first number of semiconductor micro-needles, each micro-needle extending from the surface of said silicon substrate to a first depth, each granule of said granular semiconductor material having a diameter sufficiently small to form a micro-needle having a diameter sufficiently small to cause quantum size effects in said micro-needle.

2. The method of manufacturing an aggregate of semiconductor micro-needles according to claim 1, further comprising the step of:

forming an insulating film to intervene between said dotted mask and said silicon substrate so that said dotted mask is formed on said silicon substrate via said formed insulating film.

3. The method of manufacturing an aggregate of semiconductor micro-needles to claim 1, further comprising the step of:

performing surface treatment with respect to said dotted mask.

4. The method of manufacturing an aggregate of semiconductor micro-needles according to claim 3, further comprising the step of:

forming an insulating film to intervene between said dotted mask and said silicon substrate so that said dotted mask is formed on said silicon substrate via said formed insulating film.

5. A method of manufacturing an aggregate of semiconductor micro-needles, comprising the steps of:

forming metal crystal growth nuclei on a silicon substrate;

forming a dotted mask comprising a granular semiconductor material on said crystal growth nuclei; and etching said silicon substrate using said dotted mask so as to form a first number of semiconductor micro-needles, each micro-needle extending from the surface of said silicon substrate to a first depth, each granule of said granular semiconductor material having a diameter sufficiently small to form a micro-needle having a diameter sufficiently small to cause quantum size effects in said micro-needle.

6. The method of manufacturing an aggregate of semiconductor micro-needles according to claim 5, further comprising the step of:

forming an insulating film to intervene between said dotted mask and said silicon substrate so that said dotted mask is formed on said silicon substrate via said formed insulating film.

7. A method of manufacturing a semiconductor apparatus, comprising the steps of:

forming a dotted mask comprising tin or rhodium crystal growth nuclei on a silicon substrate;

etching said silicon substrate using said dotted mask so as to form a first number of semiconductor micro-needles, each micro-needle extending from the surface of said silicon substrate to a first depth, each granule of said granular semiconductor material having a diameter sufficiently small to form a micro-needle having a diameter sufficiently small to cause quantum size effect in said micro-needle.

8. The method of manufacturing a semiconductor apparatus according to claim 7, further comprising the step of:

forming an insulating film to intervene between said dotted mask and said silicon substrate so that said dotted mask is formed on said silicon substrate via said formed insulating film.

9. The method of manufacturing a semiconductor apparatus according to claim 7, further comprising the step of:

performing surface treatment with respect to said dotted mask.

10. The method of manufacturing a semiconductor apparatus according to claim 9, further comprising the step of:

forming an insulating film to intervene between said dotted mask and said silicon substrate so that said dotted mask is formed on said silicon via said formed insulating film.

11. A method of manufacturing a semiconductor apparatus, comprising the steps of:

forming metal crystal growth nuclei on a silicon substrate;

forming a dotted mask comprising a granular semiconductor material on said crystal growth nuclei;

etching said silicon substrate using said dotted mask so as to form a first number of semiconductor micro-needles, each micro-needle extending from the surface of said silicon substrate to a first depth, each granule of said granular semiconductor material having a diameter sufficiently small to form a micro-needle having a diameter sufficiently small to cause quantum size effect in said micro-needle;

removing said dotted mask; and forming an upper electrode over the upper ends of said semiconductor needles, the upper electrode being electrically connected to each of said semiconductor micro-needles.

12. The method of manufacturing a semiconductor apparatus according to claim 11, further comprising the step of:

forming an insulating film to intervene between said dotted mask and said silicon substrate so that said dotted mask is formed on said silicon substrate via said formed insulating film.

* * * * *